United States Patent
Lin et al.

(10) Patent No.: US 12,107,022 B2
(45) Date of Patent: *Oct. 1, 2024

(54) SYSTEMS AND METHODS OF TESTING MEMORY DEVICES

(71) Applicant: Taiwan Semiconductor Manufacturing Company, Ltd., Hsinchu (TW)

(72) Inventors: Meng-Han Lin, Hsinchu (TW); Chia-En Huang, Xinfeng Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 635 days.

This patent is subject to a terminal disclaimer.

(21) Appl. No.: 17/241,299

(22) Filed: Apr. 27, 2021

(65) Prior Publication Data

US 2022/0344222 A1   Oct. 27, 2022

(51) Int. Cl.
| | |
|---|---|
| *H01L 21/00* | (2006.01) |
| *H01L 21/66* | (2006.01) |
| *H01L 23/522* | (2006.01) |
| *H01L 23/528* | (2006.01) |
| *H10B 51/20* | (2023.01) |
| *H10B 51/40* | (2023.01) |

(52) U.S. Cl.
CPC .............. *H01L 22/32* (2013.01); *H01L 22/12* (2013.01); *H01L 23/5226* (2013.01); *H01L 23/5283* (2013.01); *H10B 51/20* (2023.02)

(58) Field of Classification Search
CPC ......... H01L 22/32; H01L 22/12; H01L 22/34; H01L 22/14; H01L 23/5226
See application file for complete search history.

(56) References Cited

U.S. PATENT DOCUMENTS

| | | | | |
|---|---|---|---|---|
| 11,728,227 | B1* | 8/2023 | Lin | G01R 31/2831 |
| | | | | 324/750.3 |
| 11,735,238 | B2* | 8/2023 | Lai | G11C 7/1087 |
| | | | | 365/233.1 |
| 11,735,280 | B2* | 8/2023 | Li | H10B 20/25 |
| | | | | 365/96 |
| 11,854,914 | B2* | 12/2023 | Lin | H10B 51/40 |

* cited by examiner

*Primary Examiner* — Anthony Ho
*Assistant Examiner* — David J Goodwin
(74) *Attorney, Agent, or Firm* — FOLEY & LARDNER LLP

(57) ABSTRACT

A memory device includes a plurality of memory sub-arrays. Each of the memory sub-arrays is accessed through a staircase of word lines (WLs) and a plurality of interconnect structures. The memory device includes a plurality of test structures. Each of the test structures corresponds to one of the memory sub-arrays, and includes: (i) a staircase of test WLs that emulate the staircase of WLs coupled to the corresponding memory sub-array, and (ii) a plurality of test interconnect structures that emulate the interconnect structures coupled to the corresponding memory sub-array. The plurality of test structures are electrically coupled to one another in series.

20 Claims, 25 Drawing Sheets

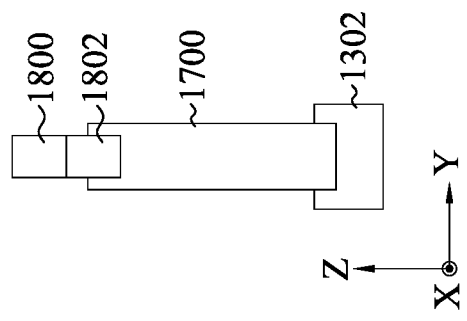
FIG. 20A
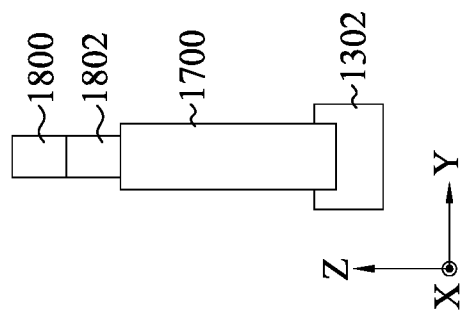
FIG. 20B
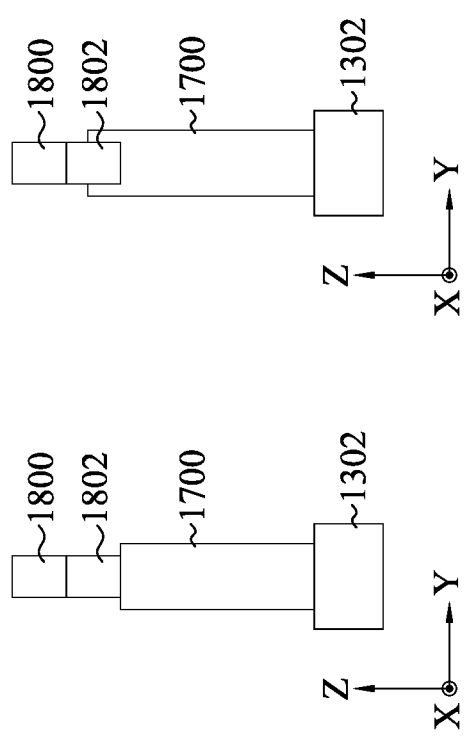
FIG. 20C
FIG. 20D
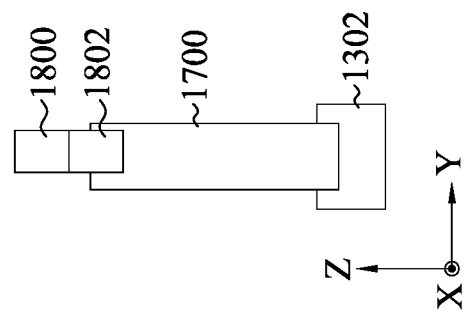
FIG. 20E
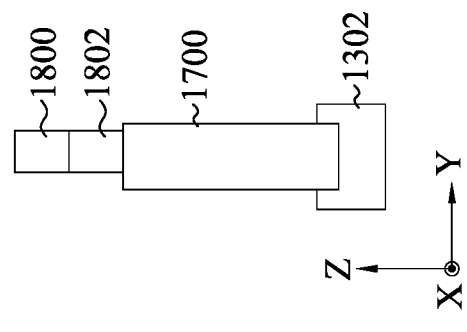
FIG. 20F
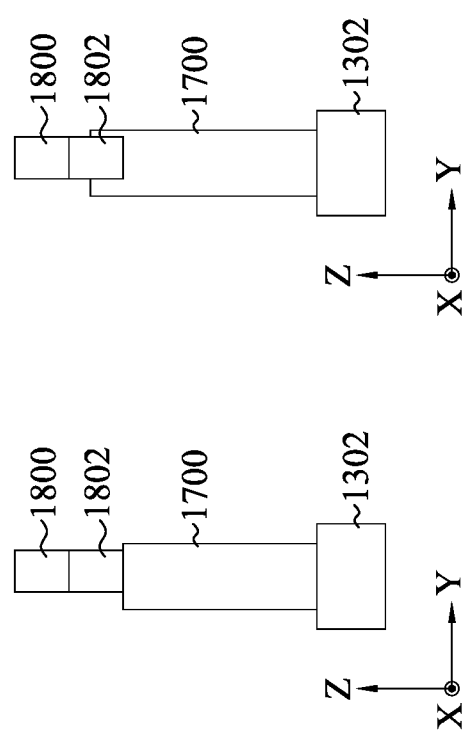
FIG. 20G
FIG. 20H

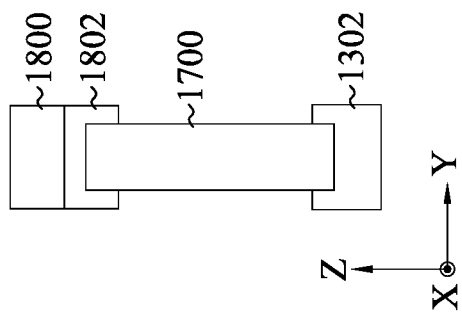
FIG. 21A
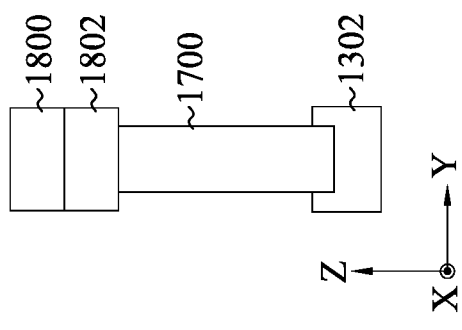
FIG. 21B
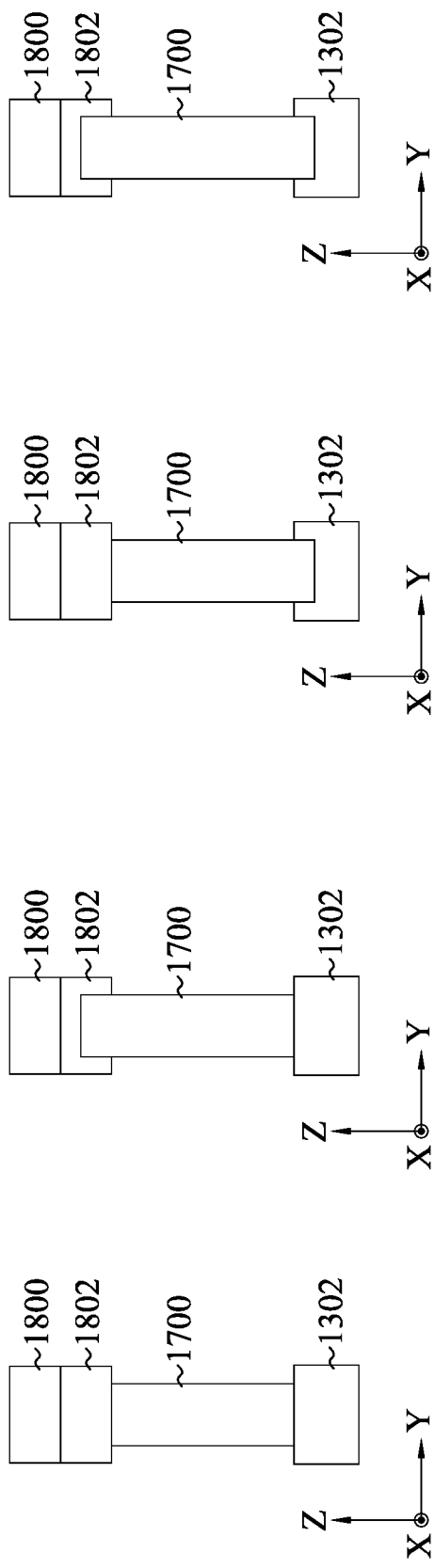
FIG. 21C
FIG. 21D
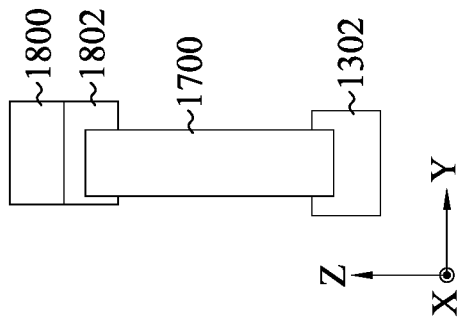
FIG. 21E
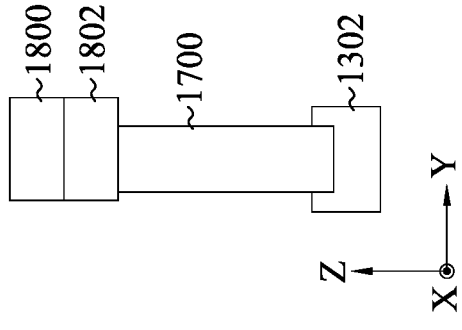
FIG. 21F
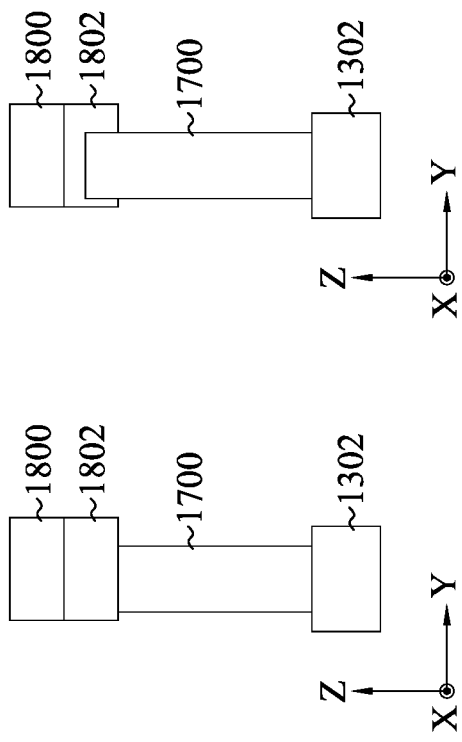
FIG. 21G
FIG. 21H

SYSTEMS AND METHODS OF TESTING MEMORY DEVICES

BACKGROUND

A non-volatile memory device retains data stored therein even when not powered. Two-dimensional memory devices in which memory cells are fabricated in a single layer over a substrate have reached physical limits in terms of increasing their degree of integration. Accordingly, three-dimensional (3D) non-volatile memory devices in which memory cells are stacked in a vertical direction over a substrate have been proposed. In general, a 3D (non-volatile) memory device includes a number of memory cells stacked on top of one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 20A, 20B, 20C, 20D, 20E, 20F, 20G, 20H, 21A, 21B, 21C, 21D, 21E, 21F, 21G, and 21H each illustrate a cross-sectional view of the three-dimensional memory device of FIGS. 9-18, in accordance with some embodiments.

DETAILED DESCRIPTION

Figure 1A:
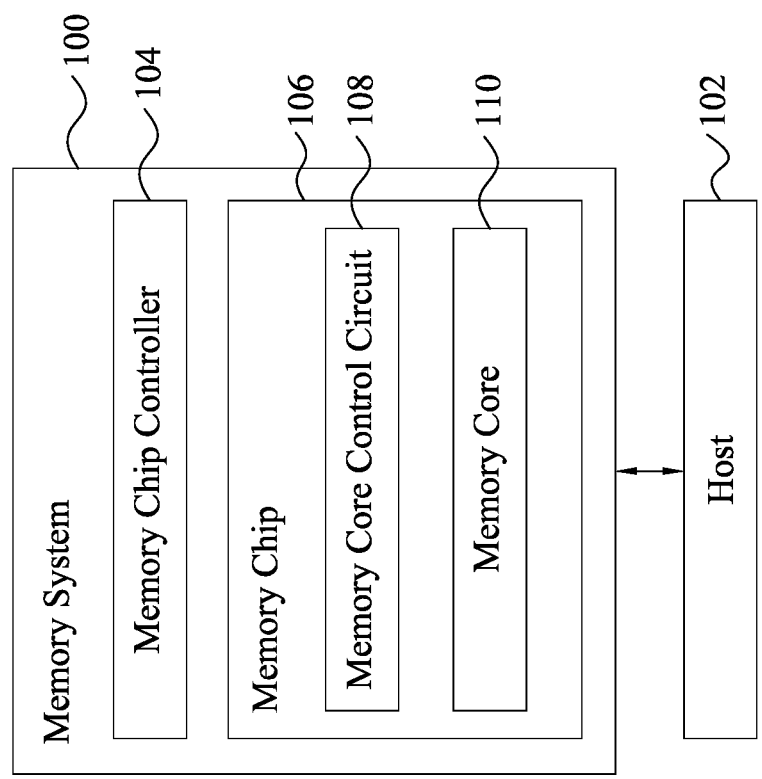
FIG. 1A illustrates a block diagram of a memory system and a host, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a 3D memory device includes a number of memory blocks. Each memory block includes at least one memory array (or sub-array) of memory cells formed in a stack of insulating layers and conductive layers. The conductive layers generally function as gates or gate electrodes of the memory cells. Over the wafer (or die) in which the memory arrays are formed, the gates can extend over one or both sides of each memory array, thereby allowing electrical interface with the memory cells included in the memory array. Such extending gates of each memory block, which are sometimes referred to as part of an interface portion of the memory block, may have a staircase profile. The interface portion can serve as an electrical interface for the memory block.

Specifically, the interface portion, in the staircase profile, can electrically couple the gates of the memory cells to one or more controllers or respective drivers. To allow the electrical coupling, a number of interconnect structures, formed as via structures, can land on respective stairs of the staircase. The via structures typically penetrate through an intermetal dielectric (IMD) material with respective different heights (or depths) to land on (e.g., contact) the corresponding stairs. However, given the different heights of the via structures, it is challenging to control whether each via structure has successfully contacted the corresponding stair. For example, some of the via structures may be formed shorter than expected, which may form an open circuit.

The present disclosure provides various embodiments of systems and methods for testing a 3D memory device. For example, while fabricating the 3D memory device including a number of memory blocks (each of which includes a memory sub-array and one or more staircase interface portions), one or more test structures can be concurrently formed next to each of the memory sub-arrays. By concurrently forming the test structures, each test structure can have one or more test staircase interface portions to emulate, mimic, simulate, or otherwise follow the staircase interface portions of a corresponding memory sub-array. Further, each test structure can include a number of test via structures electrically connect to its test staircase interface portion(s), which can also be concurrently formed with via structures of the memory sub-arrays. As such, the test via structures can emulate the profiles of the via structures of the memory sub-arrays. In various embodiments, those test via structures of each test structure can be electrically coupled to one another in series, so as to monitor or otherwise test electrical connections between the via structures and the staircase interface portions in the corresponding memory block. Further, the respective test structure(s) of the memory blocks can be electrically coupled to one another in series, which allows the memory block that may have problematic electrical connections to be quickly and accurately identified.

FIG. 1A illustrates a block diagram including a memory system 100 and a host 102, in accordance with various embodiments. The memory system 100 may include a non-volatile storage system interfacing with the host 102 (e.g., a mobile computing device). In some embodiments, the memory system 100 may be embedded within the host 102). In some embodiments, the memory system 100 may include a memory card. As shown, the memory system 100 includes a memory chip controller 104 and a memory chip 106. Although a single memory chip 106 is shown, the memory system 100 may include more than one memory chip (e.g., four, eight or some other number of memory chips). The memory chip controller 104 can receive data and commands from the host 102 and provide memory chip data to the host 102.

The memory chip controller 104 may include one or more state machines, page registers, SRAM, and control circuitry for controlling the operation of the memory chip 106. The one or more state machines, page registers, static random access memory (SRAM), and control circuitry for controlling the operation of the memory chip 106 may be referred to as managing or control circuits. The managing or control circuits may facilitate one or more memory array operations, such as forming, erasing, programming, and reading operations.

In some embodiments, the managing or control circuits (or a portion of the managing or control circuits) for facilitating one or more memory array operations may be integrated within the memory chip 106. The memory chip controller 104 and memory chip 106 may be arranged on a single integrated circuit. In other embodiments, the memory chip controller 104 and memory chip 106 may be arranged on different integrated circuits. In some cases, the memory chip controller 104 and memory chip 106 may be integrated on a system board, logic board, or a printed circuit board (PCB).

The memory chip 106 includes memory core control circuit 108 and a memory core 110. In various embodiments, the memory core control circuit 108 may include logic for controlling the selection of memory blocks (or arrays) within the memory core 110 such as, for example, controlling the generation of voltage references for biasing a particular memory array into a read or write state, generating row and column addresses, testing the electrical connections of interconnect structures of the memory blocks, which will be discussed in further detail below.

The memory core 110 may include one or more two-dimensional arrays of non-volatile memory cells or one or more three-dimensional arrays of non-volatile memory cells. In an embodiment, the memory core control circuit 108 and memory core 110 are arranged on a single integrated circuit. In other embodiments, the memory core control circuit 108 (or a portion of the memory core control circuit 108) and memory core 110 may be arranged on different integrated circuits.

An example memory operation may be initiated when the host 102 sends instructions to the memory chip controller 104 indicating that the host 102 would like to read data from the memory system 100 or write data to the memory system 100. In the event of a write (or programming) operation, the host 102 will send to the memory chip controller 104 both a write command and the data to be written. The data to be written may be buffered by the memory chip controller 104 and error correcting code (ECC) data may be generated corresponding with the data to be written. The ECC data, which allows data errors that occur during transmission or storage to be detected and/or corrected, may be written to the memory core 110 or stored in non-volatile memory within the memory chip controller 104. In an embodiment, the ECC data are generated and data errors are corrected by circuitry within the memory chip controller 104.

The memory chip controller 104 can control operation of the memory chip 106. In one example, before issuing a write operation to the memory chip 106, the memory chip controller 104 may check a status register to make sure that the memory chip 106 is able to accept the data to be written. In another example, before issuing a read operation to the memory chip 106, the memory chip controller 104 may pre-read overhead information associated with the data to be read. The overhead information may include ECC data associated with the data to be read or a redirection pointer to a new memory location within the memory chip 106 in which to read the data requested. Once a read or write operation is initiated by the memory chip controller 104, the memory core control circuit 108 may generate the appropriate bias voltages for word lines and bit lines within memory core 110, and generate the appropriate memory block, row, and column addresses.

Figure 1B:
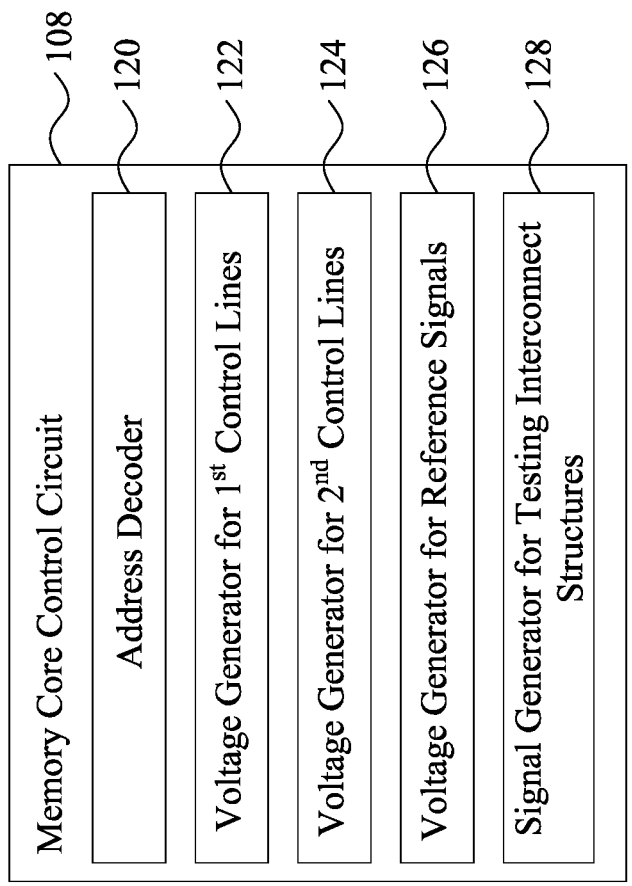
FIG. 1B illustrates a block diagram of a memory core control circuit, in accordance with some embodiments.

FIG. 1B illustrates one example block diagram of the memory core control circuit 108, in accordance with various embodiments. As shown, the memory core control circuit 108 include an address decoder 120, a voltage generator for first access lines 122, a voltage generator for second access lines 124, a signal generator for reference signals 126, and a signal generator for testing interconnect structures 128 (described in more detail below). In some embodiments, access lines may include word lines (WLs), bit lines (BLs), source/select lines (SLs), or combinations thereof. First access lines may include selected WLs, selected BLs, and/or selected SLs that are used to place non-volatile memory cells into a selected state. Second access lines may include unselected WLs, unselected BLs, and/or unselected SLs that are used to place non-volatile memory cells into an unselected state.

In accordance with various embodiments, the address decoder 120 can generate memory block addresses, as well as row addresses and column addresses for a particular memory block. The voltage generator (or voltage regulators) for first access lines 122 can include one or more voltage generators for generating first (e.g., selected) access line voltages. The voltage generator for second access lines 124 can include one or more voltage generators for generating second (e.g., unselected) access line voltages. The signal generators for reference signals 126 can include one or more voltage and/or current generators for generating reference voltage and/or current signals. The signal generator for testing interconnect structures 128 can generate control signals to control a number of switches to bypass one of the memory blocks at a time for testing the interconnect structures of the memory blocks, which will be discussed in further detail with respect to the method of FIG. 4.

Figure 1C:
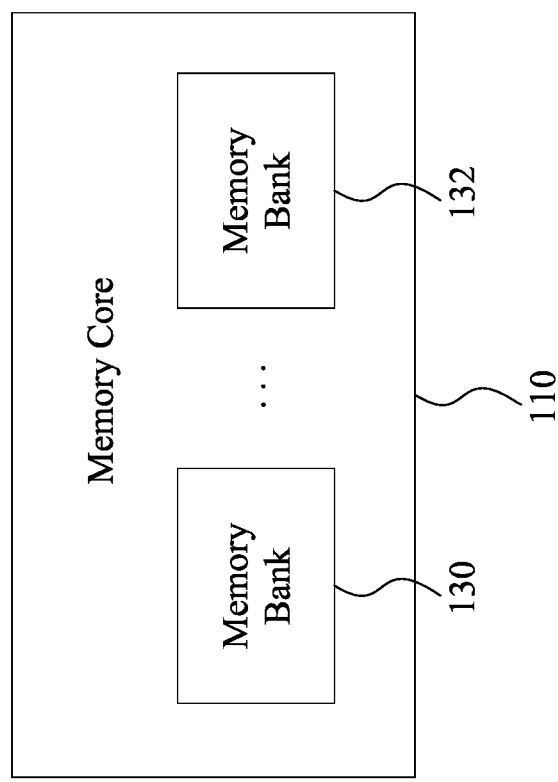
FIG. 1C illustrates a block diagram of a memory core, in accordance with some embodiments.
Figure 1D:
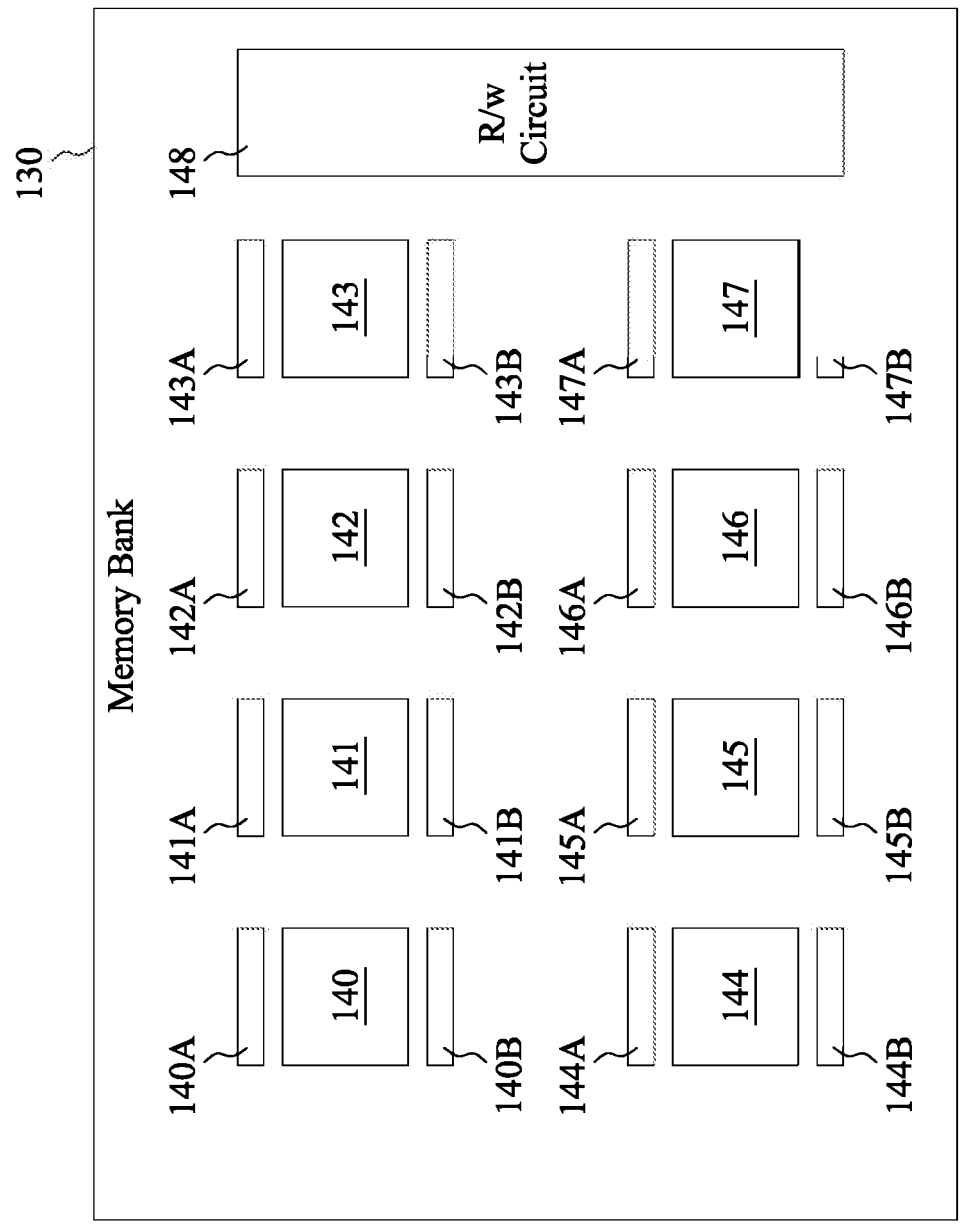
FIG. 1D illustrates a block diagram of a memory bank, in accordance with some embodiments.
Figure 1E:
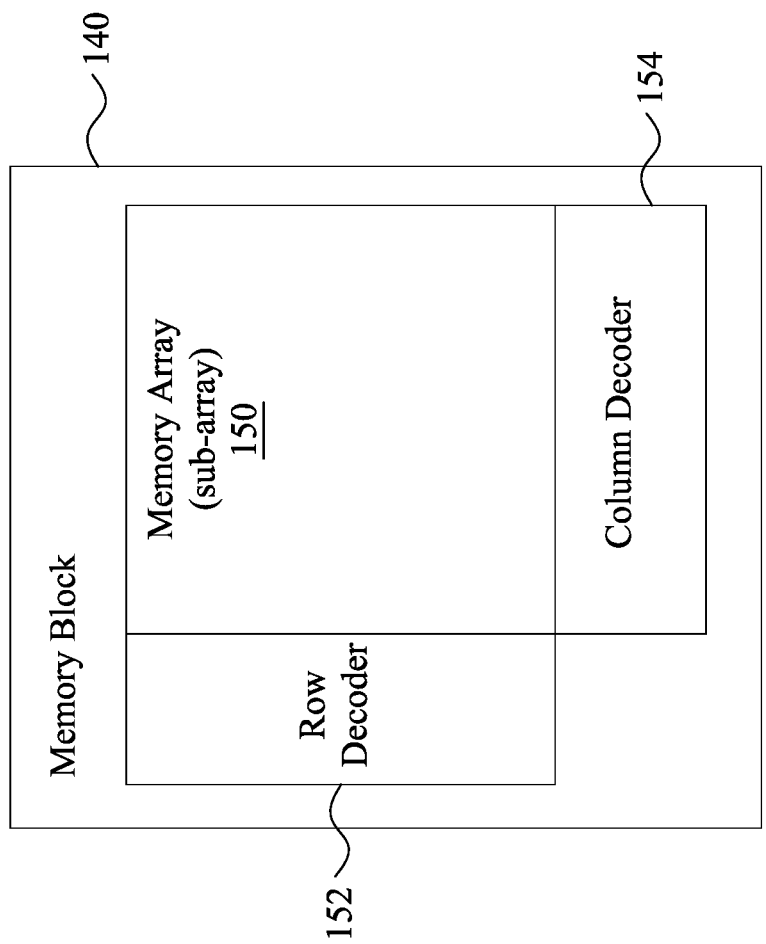
FIG. 1E illustrates a block diagram of a memory block, in accordance with some embodiments.

FIGS. 1C-1E illustrate an example organization of the memory core 110, in accordance with various embodiments. The memory core 110 includes a number of memory banks, and each memory bank includes a number of memory blocks. Although an example memory core organization is disclosed where memory banks each include memory blocks, and memory blocks each include a group of non-volatile memory cells (arranged as a memory array or sub-array), other organizations or groupings also can be used, while remaining within the scope of the present disclosure.

FIG. 1C illustrates an example block diagram of the memory core 110, in accordance with various embodiments. As shown, the memory core 110 includes memory banks 130, 132, etc. It should be appreciated the memory core 100 can include any number of memory banks, while remaining within the scope of the present disclosure. For example, a memory core may include only a single memory bank or multiple memory banks (e.g., 16 or other number of memory banks).

FIG. 1D illustrates an example block diagram of one of the memory banks (e.g., 130) shown in FIG. 1C, in accordance with various embodiments. As shown, the memory bank 130 includes memory blocks 140, 141, 142, 143, 144, 145, 146, and 147, pairs of test structures 140A and 140B, 141A and 141B, 142A and 142B, 143A and 143B, 144A and 144B, 145A and 145B, 146A and 146B, and 147A and 147B respectively corresponding to the memory blocks 140 to 147, and a read/write circuit 148. It should be appreciated the memory bank 130 can include any number of memory blocks (and any according number of the test structures), while remaining within the scope of the present disclosure. For example, a memory bank may include one or more memory blocks (e.g., 32 or other number of memory blocks per memory bank). The read/write circuit 148 can include circuitry for reading and writing memory cells within the memory blocks 140 to 147. Further, although two test structures correspond to each memory block in the illustrated example of FIG. 1D (and the following figures), it should be appreciated that any number of test structures can correspond to one memory block, while remaining within the scope of the present disclosure.

In various embodiments, the test structures 140A through 147B, together with the corresponding memory blocks 140 through 147, may be formed on a single die (e.g., a singulated or cut die). Further, each pair of test structures may be disposed next to their corresponding memory block. For example, the test structures 140A and 140B may be physically disposed on top and bottom of the memory block 140, respectively. However, it should be understood that a pair of the test structures may be physically arranged next to the corresponding memory block in any manner. Continuing using the memory block 140 as a representative example, the test structures 140A and 140B may be disposed on the left and the right of the memory block 140, respectively.

In some other embodiments, the test structures may not be present on a single die (e.g., a singulated or cut die). For example, while the memory blocks of a memory core (e.g., 110) are formed on a particular die over a wafer, the corresponding test structures may be formed along scribe lines over the wafer. A scribe line (sometimes referred to as a kerf or frame) is an area in a wafer, which is used to singulate or otherwise separate individual dies at the end of wafer processing. In such embodiments, the test structures may not be present on a singulated die.

In some embodiments, the read/write circuit 148 may be shared across multiple memory blocks within a memory bank. This allows chip area to be reduced because a single group of read/write circuit 148 may be used to support multiple memory blocks. However, in some embodiments, only a single memory block may be electrically coupled to the read/write circuit 148 at a particular time to avoid signal conflicts. In some embodiments, the read/write circuit 148 may be used to write one or more pages of data into the memory blocks 140-147 (or into a subset of the memory blocks). The non-volatile memory cells within the memory blocks 140-147 may permit direct over-writing of pages (i.e., data representing a page or a portion of a page may be written into the memory blocks 140-147 without requiring an erase or reset operation to be performed on the non-volatile memory cells prior to writing the data).

In some cases, the read/write circuit 148 may be used to program a particular non-volatile memory cell to be in one of multiple (e.g., 2, 3, etc.) data states. For example, the particular non-volatile memory cell may include a single-level or multi-level non-volatile memory cell. In one example, the read/write circuits 148 may apply a first voltage difference (e.g., 2V) across the particular non-volatile memory cell to program the particular non-volatile memory cell into a first state of the multiple data states or a second voltage difference (e.g., 1V) across the particular non-volatile memory cell that is less than the first voltage difference to program the particular non-volatile memory cell into a second state of the multiple data states.

FIG. 1E illustrates an example block diagram of one of the memory blocks (e.g., 140) of the memory bank 130 of FIG. 1D, in accordance with various embodiments. As shown, the memory block 140 includes a memory array (or sometimes referred to as a memory sub-array) 150, a row decoder 152, and a column decoder 154. As disclosed herein, the memory array 150 may include a contiguous group of non-volatile memory cells, each of which can be accessed through a respective combination of access lines (e.g., a combination of one of contiguous WLs, one of contiguous BLs, and one of contiguous SLs). Such access lines may sometimes be referred to as an interface portion of the memory block, in some embodiments. The memory array 150 may include one or more layers of non-volatile memory cells. The memory array 150 may include a two-dimensional memory array or a three-dimensional memory array. The interface portion may be formed within the memory array 150, which will be shown and discussed in further detail below.

The row decoder 152 can decode a row address and select a particular WL, when appropriate (e.g., when reading or writing non-volatile memory cells in the memory array 150). The column decoder 154 can decode a column address and select one or more BLs/SLs in the memory array 150 to be electrically coupled to read/write circuits, such as the read/write circuit 148 in FIG. 1D. As a non-limiting example, the number of WLs is in the range of 4K per memory layer, the number of BLs/SLs is in the range of 1K per memory layer, and the number of memory layers is 4, which renders about 16M non-volatile memory cells contained in the memory array 150 (of the memory block 140). Continuing with the same example, a test structure (e.g., 140A and/or 140B), corresponding to the memory block 140, may include the similar number of WLs (e.g., 4K) and the similar number of memory layers (e.g., 4), but a much less number of BLs/SLs, which can allow the test structures to occupy an optimized real estate.

Figure 2:
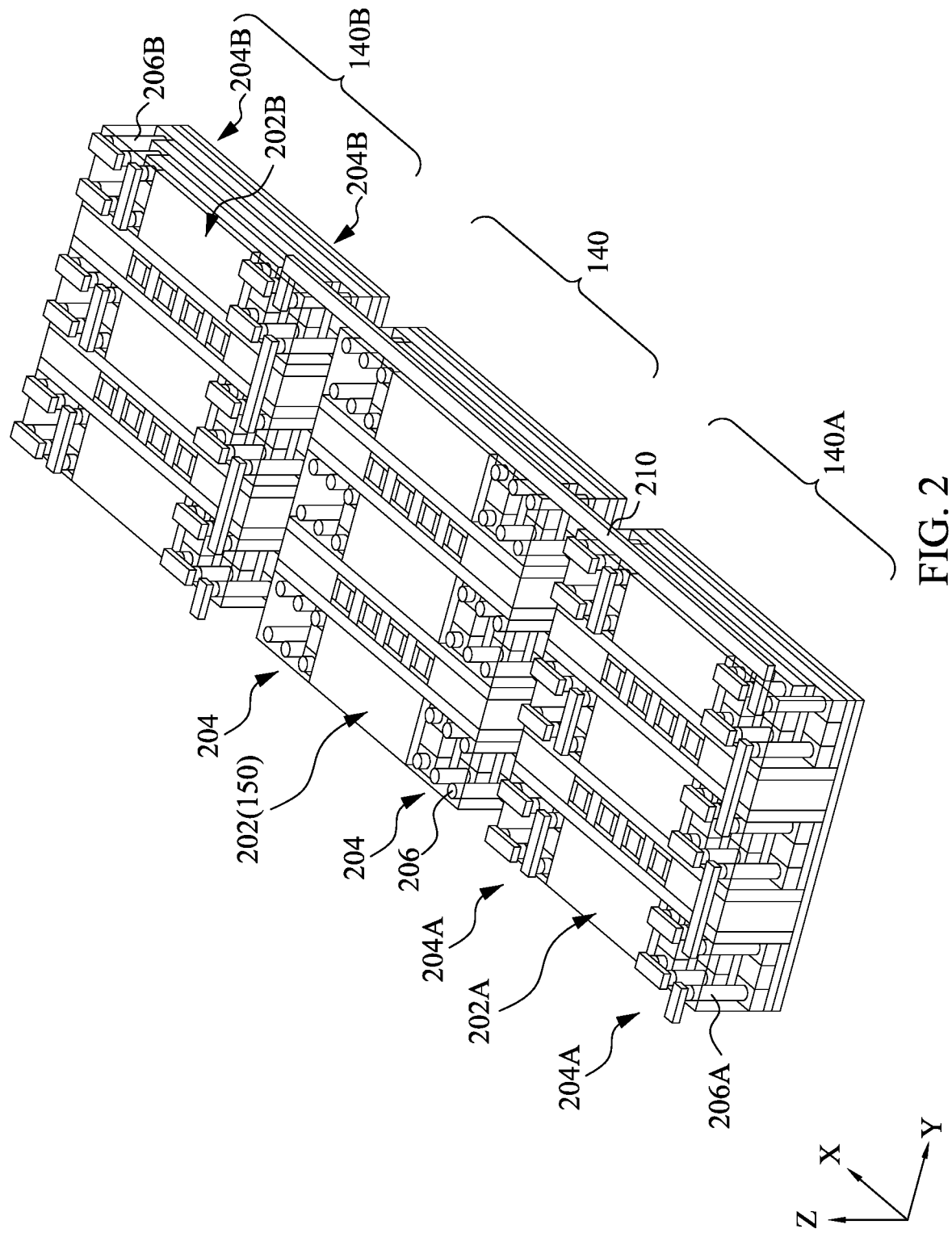
FIG. 2 illustrates a perspective view of a memory block and one or more test structures, in accordance with some embodiments.

FIG. 2 illustrates a perspective view of a portion of the memory block 140, and the test structures 140A and 140B, according to various embodiments of the present disclosure. In the following discussions, the memory block 140 (and the corresponding test structures 140A-B) are selected as a representative example. It should be understood that other memory blocks (and corresponding test structures), as disclosed herein, are substantially similar to the memory block 140 (and the test structures 140A-B), and thus, the discussions are not repeated. Further, the perspective view of FIG. 2 is simplified, and thus, it should be understood that any of various other features/components can also be included in FIG. 2, while remaining within the scope of the present disclosure. For example, a number of conductive structures formed over the memory block 140 for WL, BL, and SL routing are not shown.

As shown, the memory block 140 includes the memory array (or sub-array) 150, which is herein referred to as memory array 202. Such a memory array 202 includes a number of memory cells formed across a number of memory layers (e.g., 3 memory layers as shown) stacked on top of one another along a vertical direction, e.g., the Z direction. Each of the memory cells may include a single-gate or a surrounding-gate transistor, which will be discussed in further detail below. The memory block 140 includes a number of interface portions 204 located across the memory array 202, which allows each memory cell of the memory array 202 to be accessed (or otherwise controlled). In some embodiments, the interface portions 204 each has a staircase or step profile in the Z-direction, as described later in further detail herein. To electrically access the memory array 202 through the interface portion 204, the memory block 140 further includes a number of interconnect structures 206 (e.g., via structures) extending along the Z direction that land on respective stairs of the interface portion 204.

In various embodiments, each of the test structures 140A and 140B is formed to emulate the interface portion 204 and interconnect structures 206 of the memory block 140. Thus, each of the test structures 140A and 140B can have the similar configuration as the memory block 140. For example, the test structure 140A includes a test memory array 202A having a number of memory cells formed across a number of memory layers, one or more test interface portions 204A (each of which has a staircase or step profile), and a number of test interconnect structures 206A; and the test structure 140B includes a test memory array 202B having a number of memory cells formed across a number of memory layers, one or more test interface portions 204B (each of which has a staircase or step profile), and a number of test interconnect structures 206B.

Further, the test interconnect structures 206A of the test structure 140A are electrically coupled to one another through a number of conductive structures 210; and the test interconnect structures 206B of the test structures 140B are electrically coupled to one another through a number of conductive structures 210. Specifically, the test interconnect structures 206A may be electrically coupled to one another in series; and the test interconnect structures 206B may be electrically coupled to one another in series. Such serially connected test interconnect structures 206A and serially connected test interconnect structures 206B may be electrically connected to each other through a number of conductive structures 210.

By electrically coupling the test interconnect structures of at least one of the test structures 140A or 140B in series (while electrically isolated from the interconnect structures 206 of the memory block 140), electrical connections of the interconnect structures 206 can be accurately examined through the at least one test structure, and normal operation of the memory block 140 will not be interfered. For example, since the test interconnect structures of the test structure(s) are formed concurrently with the interconnect structures within the memory block 140 (e.g., through the same lithography process, and then the same etching process), any defect formed on the interconnect structures within the memory block 140 can be mirrored to (or reflected on) the test interconnect structures within the test structure(s). As such, by testing whether the level of a current flowing through the serially connected test interconnect structures satisfies a condition (e.g., less than a threshold), whether there is any open circuit present between the test interconnect structures and the test interface portions can be identified or otherwise determined. Further, by serially connecting the respective test structures of different memory blocks, which of the memory blocks contains electrical connection issues in its interconnect structures can also be accurately identified, which will be discussed in further detail as follows.

Figure 3:
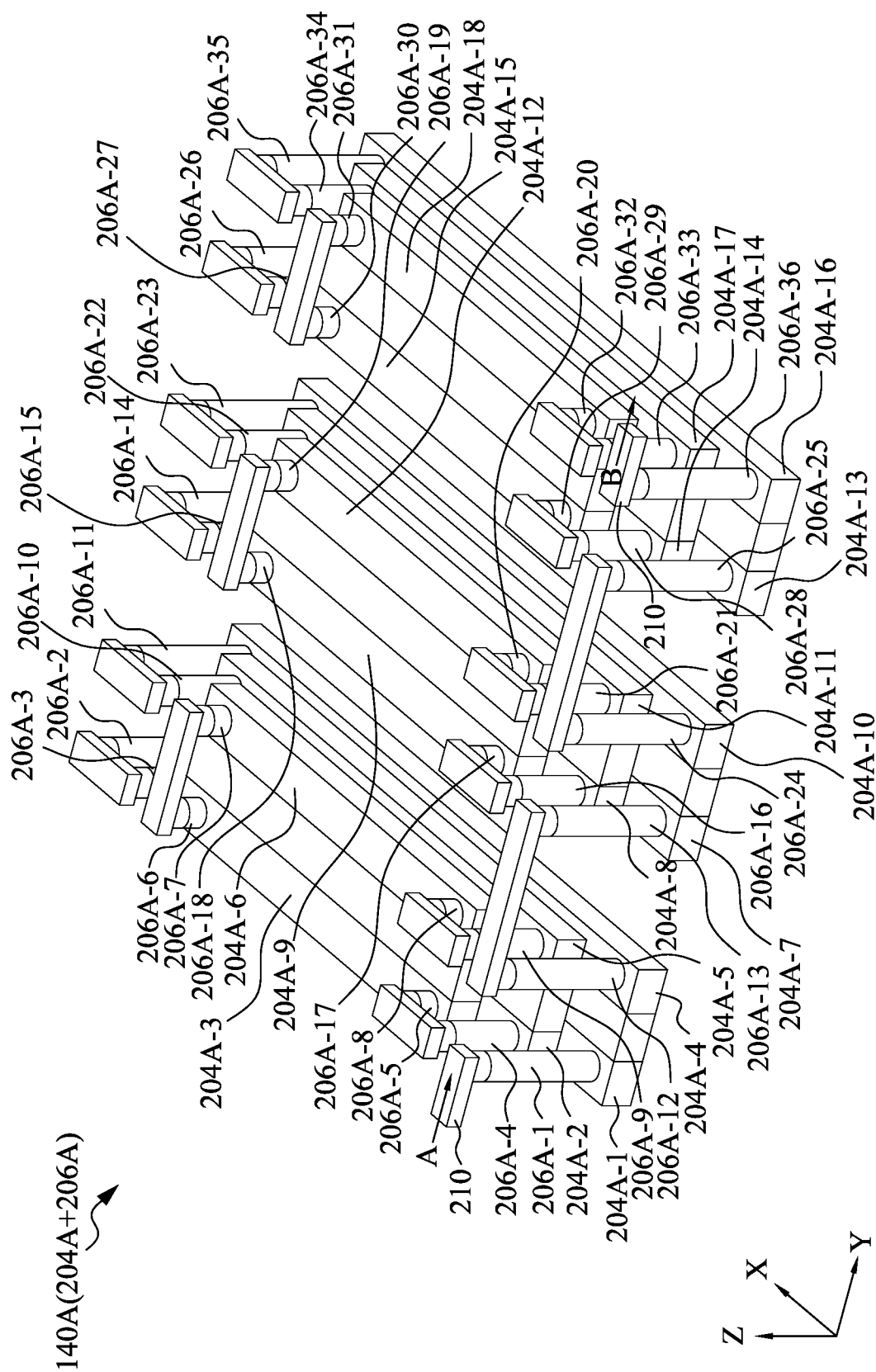
FIG. 3 illustrates a perspective view of a portion of a test structure including an interface portion and a number of interconnect structures, in accordance with some embodiments.

To illustrate how to test the electrical connections of a number of serially connected test interconnect structures within a test structure, a portion of the test structure 140A that includes only the test interface portions 204A and the test interconnect structures 206A, which is selected as a representative example, is reproduced in FIG. 3.

As illustrated, the test interface portions 204A includes a number of test conductive structures: 204A-1, 204A-2, 204A-3, 204A-4, 204A-5, 204A-6, 204A-7, 204A-8, 204A-9, 204A-10, 204A-11, 204A-12, 204A-13, 204A-14, 204A-15, 204A-16, 204A-17, and 204A-18, that are (e.g., physically and electrically) separated from one another, either along the Z direction or the Y direction. In various embodiments, the test conductive structures 204A-1 through 204A-18 can mimic the profiles of conductive structures within the memory block 140, which function as WLs or gate electrodes of the memory cells of the memory block 140, which will be discussed in further detail below.

For example, the test conductive structures 204A-1, 204A-4, 204A-7, 204A-10, 204A-13, and 204A-16, disposed in a first memory layer, are separated from one another along the Y direction; the test conductive structures 204A-2, 204A-5, 204A-8, 204A-11, 204A-14, and 204A-17, disposed in a second memory layer, are separated from one another along the Y direction; and the test conductive structures 204A-3, 204A-6, 204A-9, 204A-12, 204A-15, and 204A-18, disposed in a third memory layer, are separated from one another along the Y direction.

The test conductive structures 204A-1, 204A-2, and 204A-3, respectively disposed in the first to third memory layers, are separated from one another along the Z direction; the test conductive structures 204A-4, 204A-5, and 204A-6, respectively disposed in the first to third memory layers, are separated from one another along the Z direction; the test conductive structures 204A-7, 204A-8, and 204A-9, respectively disposed in the first to third memory layers, are separated from one another along the Z direction; the test conductive structures 204A-10, 204A-11, and 204A-12, respectively disposed in the first to third memory layers, are separated from one another along the Z direction; the test conductive structures 204A-13, 204A-14, and 204A-15, respectively disposed in the first to third memory layers, are separated from one another along the Z direction; and the test conductive structures 204A-16, 204A-17, and 204A-18, respectively disposed in the first to third memory layers, are separated from one another along the Z direction.

As the test conductive structures 204A-1 through 204A-18 follow the staircase profile of the conductive structures within the memory block 140, in various embodiments, the test conductive structures 204A-1 through 204A-18 can present a staircase profile. Specifically, the test conductive structures at the bottommost memory layer may extend along a lateral direction with a longest length, the test conductive structures at the next upper memory layer may extend along the same lateral direction with a second longest length, and so on. For example in FIG. 3, the test conductive structures 204A-1, 204A-4, 204A-7, 204A-10, 204A-13, and 204A-16, disposed in the first memory layer, each extend along the X direction with a longest length, the test conductive structures 204A-2, 204A-5, 204A-8, 204A-11, 204A-14, and 204A-17, disposed in the second memory layer, each extend along the X direction with a second longest length, and the test conductive structures 204A-3, 204A-6, 204A-9, 204A-12, 204A-15, and 204A-18, disposed in the third memory layer, each extend along the X direction with a third longest length.

With such a staircase profile, each of the test conductive structures 204A-1 through 204A-18 (of the test interface portion 204A) can be electrically coupled to one another (or other components) in series, through one or more of the test interconnect structures 206A that extend along the Z direction, e.g., via structures, and one or more of the conductive structures that extend along either the X or Y direction, e.g., metal routings. Hereinafter, the test interconnect structures 206A coupling the staircase structures to one another are referred to as "test staircase (SC) vias 206A," and the conductive structures 210 further coupling the test SC vias 206A to one another are referred to as "metal routings 210."

For example in FIG. 3, the test conductive structure 204A-1 is coupled to one of the metal routings 210 through test SC via 206A-1 and to the test conductive structure 204A-2 through test SC vias 206A-2 and 206A-3, respectively; the test conductive structure 204A-2 is coupled to the test conductive structure 204A-3 through test SC vias 206A-4 and 206A-5; the test conductive structure 204A-3 is coupled to the test conductive structure 204A-6 through test SC vias 206A-6 and 206A-7; the test conductive structure 204A-6 is coupled to the test conductive structure 204A-5 through test SC vias 206A-8 and 206A-9; the test conductive structure 204A-5 is coupled to the test conductive structure 204A-4 through test SC vias 206A-10 and 206A-11; the test conductive structure 204A-4 is coupled to the test conductive structure 204A-7 through test SC vias 206A-12 and 206A-13; the test conductive structure 204A-7 is coupled to the test conductive structure 204A-8 through test SC vias 206A-14 and 206A-15; the test conductive structure 204A-8 is coupled to the test conductive structure 204A-9 through test SC vias 206A-16 and 206A-17; the test conductive structure 204A-9 is coupled to the test conductive structure 204A-12 through test SC vias 206A-18 and 206A-19; the test conductive structure 204A-12 is coupled to the test conductive structure 204A-11 through test SC vias 206A-20 and 206A-21; the test conductive structure 204A-11 is coupled to the test conductive structure 204A-10 through test SC vias 206A-22 and 206A-23; the test conductive structure 204A-10 is coupled to the test conductive structure 204A-13 through test SC vias 206A-24 and 206A-25; the test conductive structure 204A-13 is coupled to the test conductive structure 204A-14 through test SC vias 206A-26 and 206A-27; the test conductive structure 204A-14 is coupled to the test conductive structure 204A-15 through test SC vias 206A-28 and 206A-29; the test conductive structure 204A-15 is coupled to the test conductive structure 204A-18 through test SC vias 206A-30 and 206A-31; the test conductive structure 204A-18 is coupled to the test conductive structure 204A-17 through test SC vias 206A-32 and 206A-33; the test conductive structure 204A-17 is coupled to the test conductive structure 204A-16 through test SC vias 206A-34 and 206A-35; and the test conductive structure 204A-16 is coupled to one of the metal routings 210 through test SC via 206A-36.

With such a conduction path by serially connecting the test SC vias 206 and test conductive structures 204A, electrical connections between the test SC vias 206 and the test conductive structures 204A can be accurately examined. In various embodiments, by applying a first signal (e.g., a voltage signal) on one end of the test structure 140A (arrow "A" indicated in FIG. 3), the level of a second signal (e.g., a current signal) detected on the other end of the test structure 140A (arrow "B" indicated in FIG. 3) can be used to determine whether one or more open circuits are present along this conduction path. For example, if there is any open circuit present along the conduction path, the level of the second signal may be lower than a threshold. The threshold can be pre-calibrated based on various process parameters (e.g., the resistivity of a material of the test SC vias 206, the resistivity of a material of the test conductive structures 204A, a number of the test SC vias 206, a number of the test conductive structures 204A, etc.). On the other hand, if there is no open circuit present, the level of the second signal should be equal to or greater than the threshold.

In response to determining the presence of an open circuit in the test structure, it is determined that an open circuit can also be present between the SC vias and conductive structures (e.g., WLs) of a corresponding memory block. This can be because the memory block and the test structure share the same processing steps to make the SC vias and test SC vias. In some embodiments, more than one test structure, e.g., serially connecting the test structures 140A and 140B as illustrated in FIG. 2, can be used to test the electrical connections between SC vias and WLs in a corresponding memory block, e.g., the memory block 140. Further, the operation principle can be applied to test a number of memory blocks, the memory blocks 140 to 147, which will be discussed with respect to the method of FIG. 4.

Figure 4:
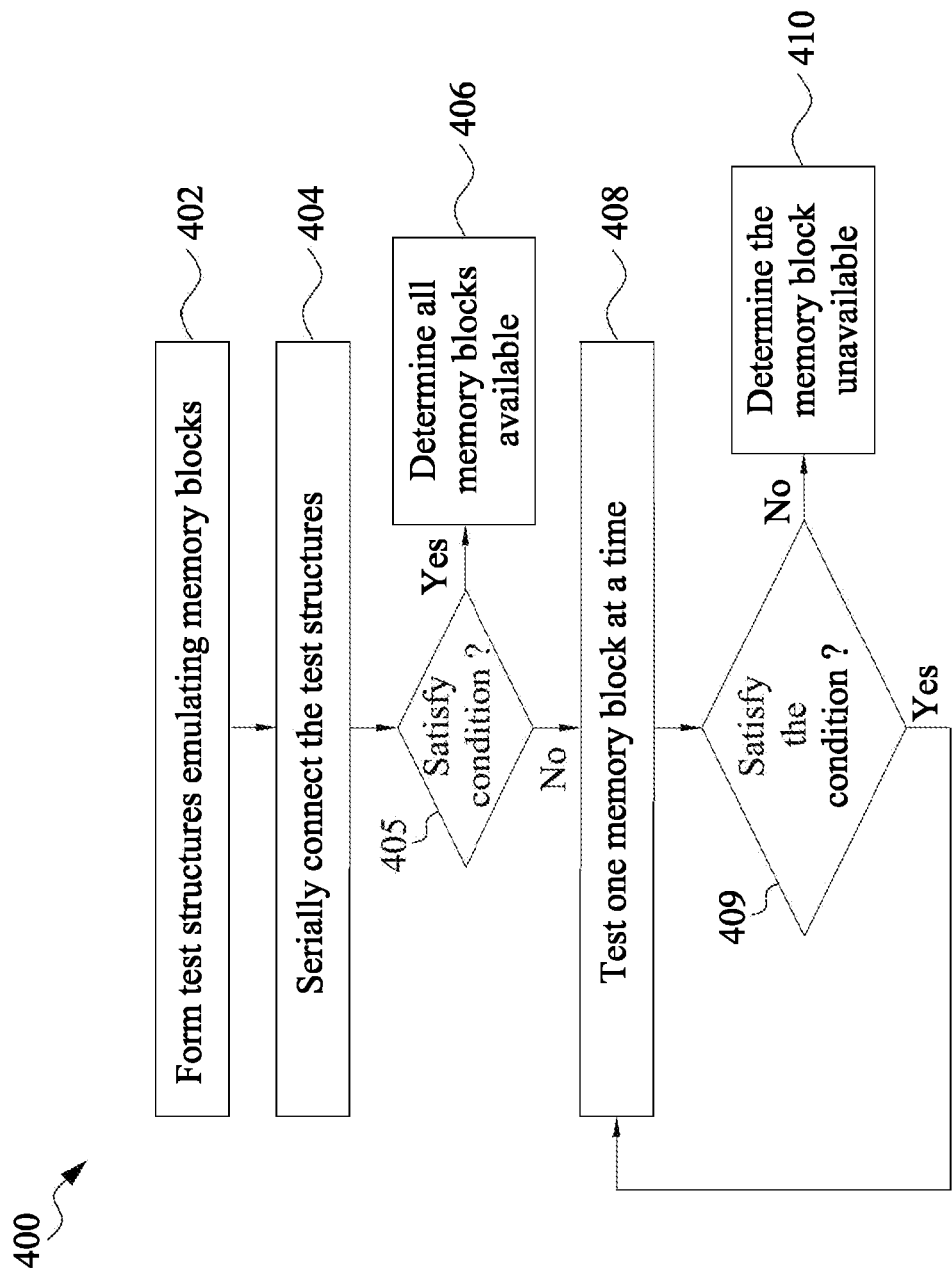
FIG. 4 illustrates a flow chart of an example method to test a three-dimensional memory device, in accordance with some embodiments.

Referring to FIG. 4, depicted is a flow chart of an example method 400 for testing electrical connections of SC vias of a number of memory blocks, in accordance with various embodiments. Some of the functionalities or operations of the method 400 may be implemented using, or performed by, one or more components of the memory core control circuit 108 depicted in FIG. 1B, e.g., the signal generator for testing interconnect structures 128 (hereinafter "signal generator 128"). It is noted that the method 400 is merely an example, and is not intended to limit the present disclosure. Accordingly, it is understood that additional operations may be provided before, during, and after the method 400, and that some other operations may only be briefly described herein.

The method 400 start with operation 402 in which a number of test structures that emulate a number of memory blocks, respectively, are formed. In some embodiments, there can be one or more test structures that emulate each memory block. The one or more test structures can be disposed next to its or their corresponding memory block. In some embodiments, each of the test structures can emulate, simulate, or otherwise follow at least the staircase interface portions (e.g., conductive structures (WLs)) and the interconnect structures (e.g., SC vias) of a corresponding memory block.

Using the memory bank 130 that includes eight memory blocks 140 to 147 (FIG. 1D) as an example in the following discussions of the method 400, FIG. 5 reproduces four of these memory blocks 140 to 143, with their corresponding (emulating) test structures 140A-B to 143A-B disposed next thereto, respectively. However, it should be appreciated that the method 400 is not limited to test any number of memory blocks. For example, by forming a number of test structures in accordance with any number of memory blocks, the method 400 can be used to test or otherwise monitor the electrical connections of each of such memory blocks. In various embodiments, the test structures 140A-B can each have a number of test conductive structures (e.g., 204A-1 through 204A-18 as shown in FIG. 3) that emulate conductive structures (WLs) of the memory block 140, and a number of test SC vias (e.g., 206A-1 through 206A-36 as shown in FIG. 3) that emulate SC vias of the memory block 140.

The method 400 proceeds to operation 404 in which the test structures are electrically connected to one another in series. In addition to electrically coupling the test conductive structures through the test SC vias within each test structure in series (as illustrated with respect to FIG. 3), one of the one or more (e.g., 2) test structures, corresponding to a particular memory block, is connected to the other of the one or more test structures. Further, one of the one or more test structures, corresponding to a first memory block, is connected to one of the one or more test structures, corresponding to a second memory block. Such a connection across different memory blocks may be controlled through a number of switches. In some embodiments, the signal generator 128 can control (e.g., activate/inactivate, or otherwise turn on/off) those switches, so as to connect all of the memory blocks in series or bypass one or more of the memory blocks, which will be discussed below.

Figure 5:
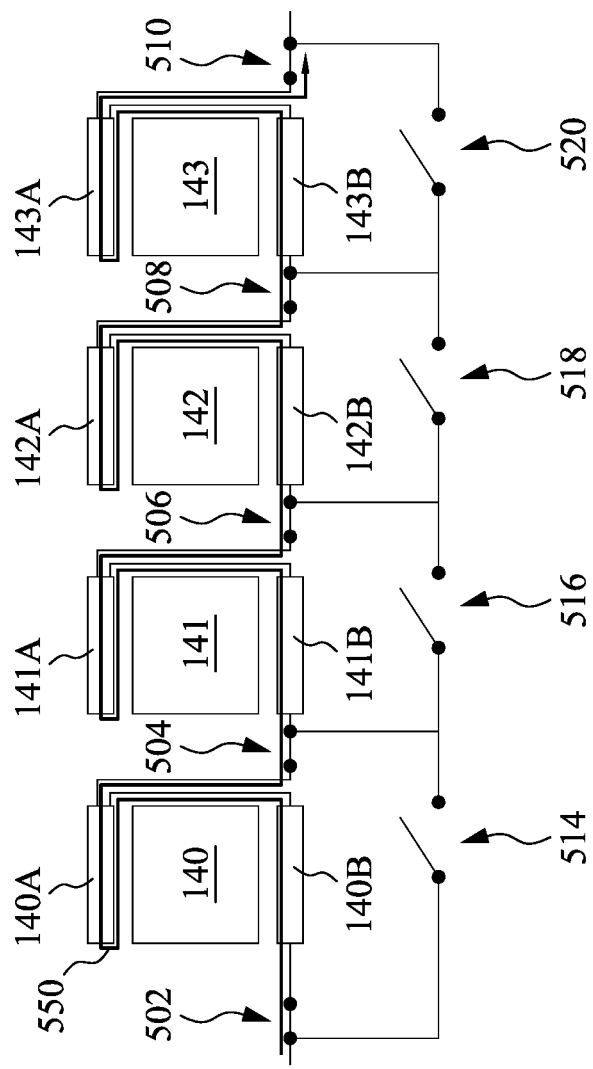
FIG. 5 illustrates a block diagram of a number of test structures electrically coupled to one another in series, in accordance with some embodiments.

For example in FIG. 5, the test structures 140A and 140B, corresponding to the memory block 140, are connected to each other. Further, the test structure 140B can be connected to a component (not shown) through a switch 502 (when activated), and the test structure 140A can be connected to one of the test structures, 141B, corresponding to the next memory block 141, through a switch 504 (when activated). The test structures 141A and 141B, corresponding to the memory block 141, are connected to each other. Further, the test structure 141A is connected to one of the test structures, 142B, corresponding to the next memory block 142, through a switch 506 (when activated). The test structures 142A and 142B, corresponding to the memory block 142, are connected to each other. Further, the test structure 142A is connected to one of the test structures, 143B, corresponding to the next memory block 143, through a switch 508 (when activated). The test structures 143A and 143B, corresponding to the memory block 143, are connected to each other. Further, the test structure 143A is connected to a component (not shown) through a switch 510 (when activated).

Moreover, switches 514, 516, 518, and 520 can provide one or more bypass paths. Each of the switches can correspond to a respective memory block to bypass the memory block (and its corresponding test structure(s)). Specifically, the switch 514 can be alternately activated with respect to the switch 504 to bypass the memory block 140; the switch 516 can be alternately activated with respect to the switch 506 to bypass the memory block 141; the switch 518 can be alternately activated with respect to the switch 508 to bypass the memory block 142; and the switch 520 can be alternately activated with respect to the switch 510 to bypass the memory block 143. For example, when the switch 504 is deactivated and the switch 514 is activated, the memory block 140 (and the corresponding test structures 140A-B) can be bypassed; when the switch 506 is deactivated and the switch 516 is activated, the memory block 141 (and the corresponding test structures 141A-B) can be bypassed; when the switch 508 is deactivated and the switch 518 is activated, the memory block 142 (and the corresponding test structures 142A-B) can be bypassed; and when the switch 510 is deactivated and the switch 520 is activated, the memory block 143 (and the corresponding test structures 143A-B) can be bypassed.

In some embodiments, each of the switches 502 to 520 may include an n-type metal-oxide-semiconductor (MOS) transistor, a p-type MOS transistor, a transmission gate, a fuse, an anti-fuse, or combinations thereof. It should be understood that the switches 502 to 520 can each include a device/feature suitable to functions as a switch, while remaining within the scope of the present disclosure. In some embodiments, the switches 502 to 520 can be formed as part of a memory device that contains the memory blocks 140-143. Further, the switches 502 to 520 can be formed above or below the memory blocks 140-143. For example, the switches 502 to 520 may be formed on the front-end of a substrate, while the memory blocks 140-143 may be formed on the back-end of the substrate. In another example, the memory blocks 140-143 may be formed on the back-end of a substrate, and the switches 502 to 520 may also be formed on the back-end, and over the memory blocks 140-143. In yet another example, the switches 502 to 520 can be embedded into processing of the memory blocks 140-143. In yet another example, the switches 502 to 520 can be separated formed as a separated device, and then integrated into a memory device containing the memory blocks 140-143.

In some embodiments, the signal generator 128, by default, can activate the switches 502 to 510 and deactivate the switches 514 to 520, so as to electrically connect the test structures in series (operation 404). As such, a conduction path 550 can be provided through the test structures 140B, 140A, 141B, 141A, 142B, 142A, 143B, and 143A, as shown in FIG. 5.

Next, the method 400 proceeds to a first determination operation 405 to determine whether a condition is satisfied. For example, the signal generator 128 can apply a first signal (e.g., a voltage signal) on one end of the conduction path 550, and detect the level of a second signal (e.g., a current signal) on the other end of the conduction path 550. Upon detecting the second signal, the signal generator 128 can determine whether the level of the second signal satisfies a condition (e.g., greater than a threshold). The threshold can be pre-calibrated based on various process parameters (e.g., the resistivity of a material of the test SC vias of the test structures 140 to 143, the resistivity of a material of the test SC vias of the test conductive structures of the test structures 140 to 143, a number of the test SC vias formed across the test structures 140 to 143, a number of the test conductive structures formed across the test structures 140 to 143, etc.).

If the condition is satisfied, the method 400 proceeds to operation 406 to determine all the memory blocks 140 to 143 as available memory blocks. Alternatively stated, the electrical connections between the SC vias and the conductive structures (WLs) of each of the memory blocks 140 to 143 can be determined as having no open circuit issues. On the other hand, if the condition is not satisfied, the method 400 proceeds to operation 408 to test one of the memory blocks at a time. To test one of the memory blocks at a time, the rest of the memory blocks (and their test structure(s)) may be bypassed, which allows the memory block(s) that have open circuit issues to be identified.

Figure 6:
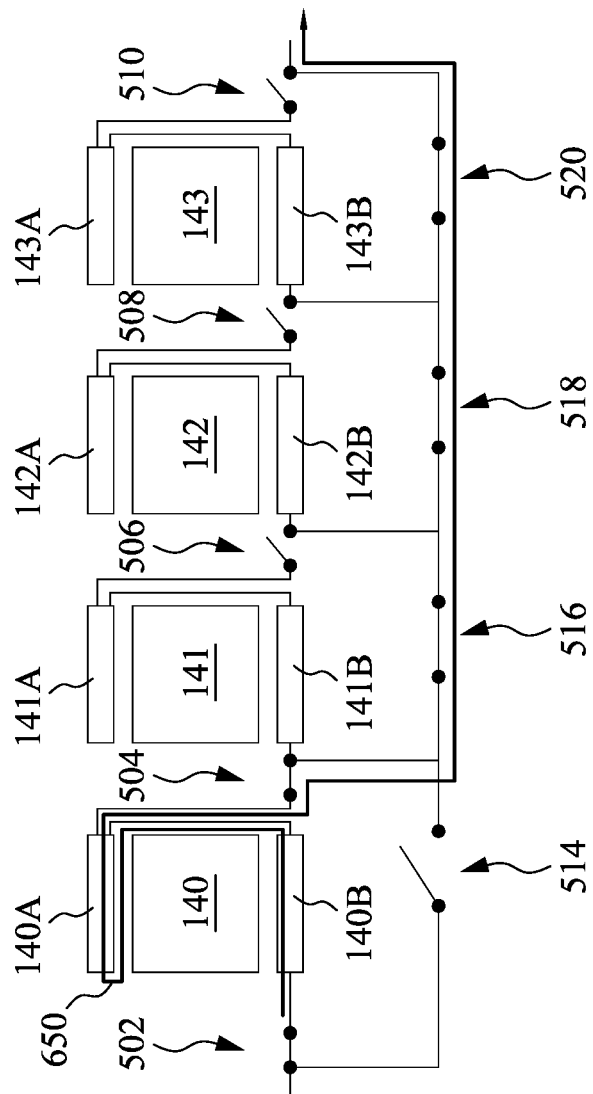
FIG. 6 illustrates an example block diagram of a number of test structures in which some of the test structures are bypassed, in accordance with some embodiments.

For example, upon determining that the level of the detected second signal does not satisfy the threshold (at operation 405), the signal generator 128 can first test the memory block 140 by bypassing the rest of the memory blocks (e.g., the memory blocks 141 to 143 in the current example). Specifically, the signal generator 128 can deactivate the switches 506 through 514 and activate the switches 502 through 504 so as to form a conduction path 650. The conduction path 650 can be provided through only the test structures for the memory block 140 being tested (e.g., 140A and 140B), as illustrated in FIG. 6. Along such a conduction path, the test structures, corresponding to the rest of the memory blocks 141 to 143, are bypassed. The signal generator 128 can again determine whether the level of the second signal satisfies the threshold (operation 409).

If not (i.e., the level of the second signal equal to or less than the threshold), the method 400 can proceed to operation 410 in which the tested memory block is determined to have the connection issues. In some embodiments, the signal generator 128 may determine the currently tested memory block as unavailable. The signal generator 128 can record identification (e.g., address information) of such an unavailable memory block, which may be used as flag to allow a user (e.g., host 102 of FIG. 1A) to skip accessing the memory block.

Figure 7:
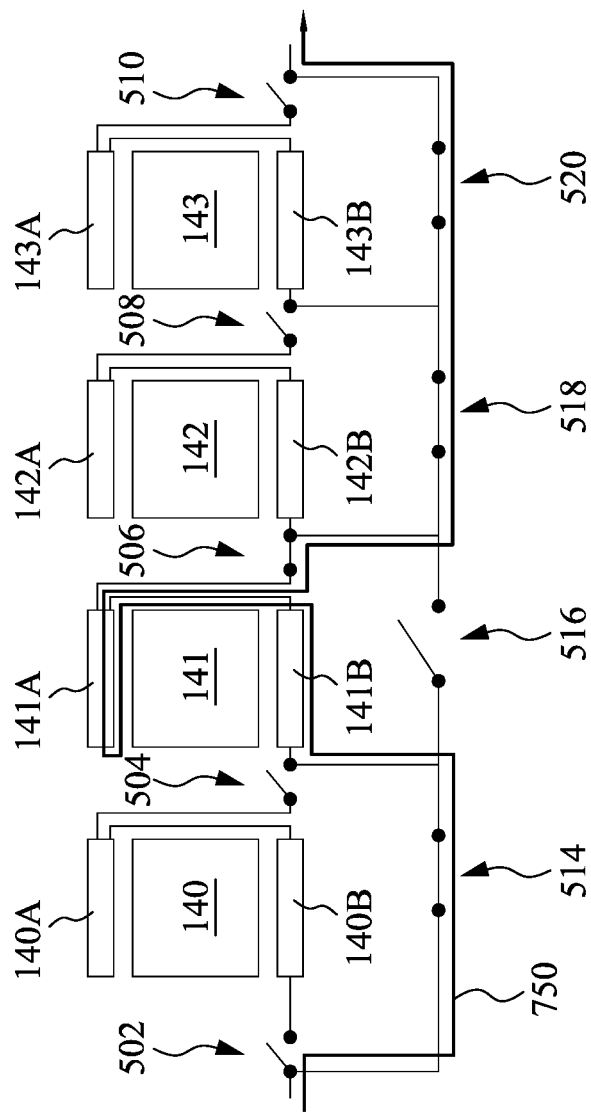
FIG. 7 illustrates another example block diagram of a number of test structures in which some of the test structures are bypassed, in accordance with some embodiments.

On the other hand, if so (i.e., the level of the second signal greater than the threshold), the method 400 can again proceed to operation 408 to test the next memory block by bypassing the rest of the memory blocks. For example, the signal generator 128 can then test the memory block 141 by bypassing the rest of the memory blocks (e.g., the memory blocks 140, 142, and 143 in the current example). Specifically, the signal generator 128 can deactivate the switches 502 through 510 and 516, and activate the switches 514, 518, and 520 so as to form a conduction path 750. The conduction path 750 can be provided through only the test structures for the memory block 141 being tested (e.g., 141A and 141B), as illustrated in FIG. 7. Along such a conduction path, the test structures, corresponding to the rest of the memory blocks 140, 142, and 143, are bypassed. The signal generator 128 can again determine whether the level of the second signal satisfies the threshold (operation 409). If not, the signal generator 128 may determine the currently tested memory block as unavailable; and if so, the signal generator 128 may continue testing the rest of the memory blocks by iteratively performing the operations 408 and 409. The signal generator 128 may continue performing such an iteration of operations until the unavailable memory block(s) are identified.

Figure 8:
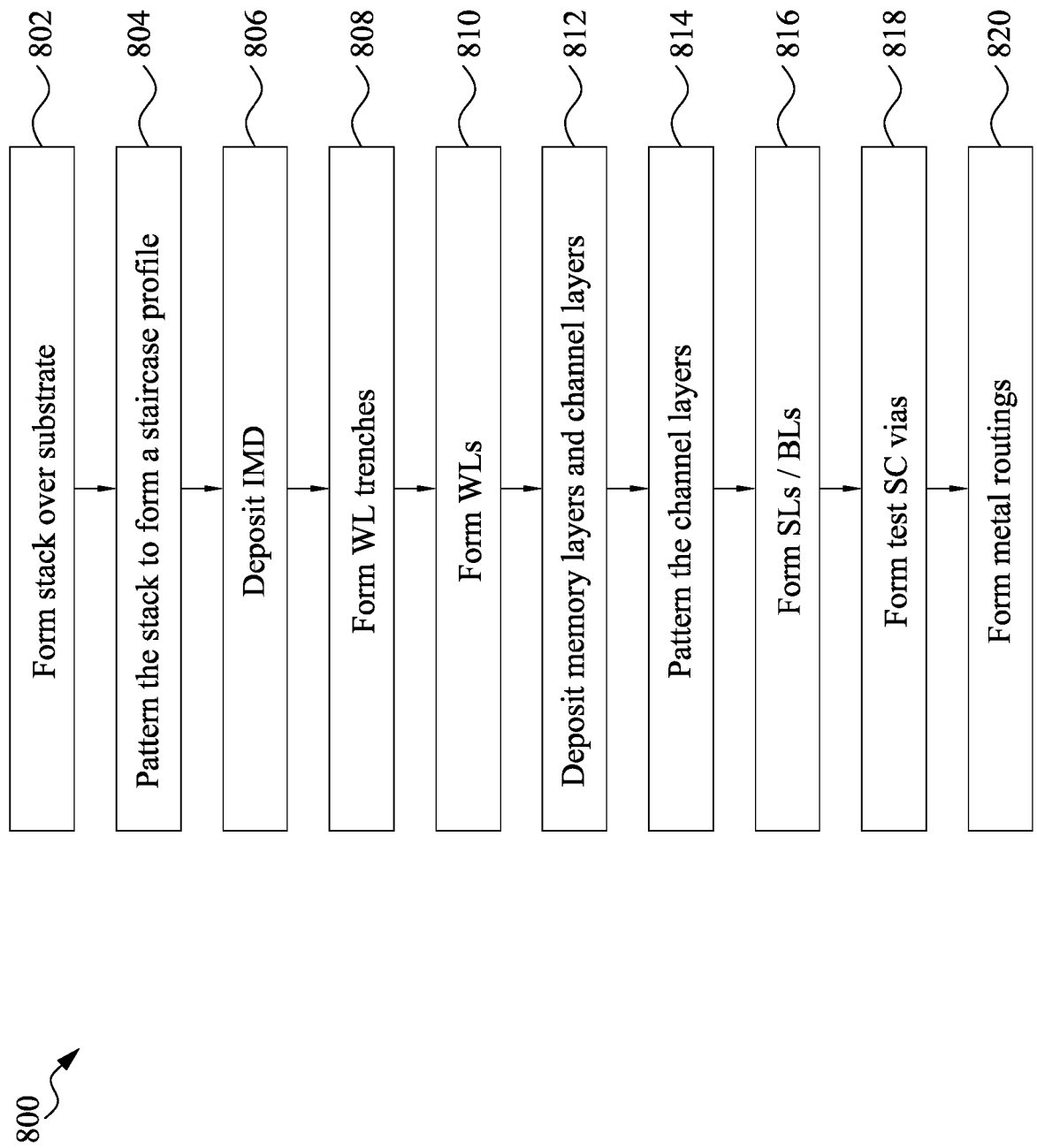
FIG. 8 illustrates a flow chart of an example method to make a three-dimensional memory device, in accordance with some embodiments.

FIG. 8 illustrates a flowchart of a method 800 to form a memory device, according to various embodiments. For example, at least some of the operations (or steps) of the method 800 can be used to form a three-dimensional memory device (e.g., any of the test structures 140A-B, 141A-B, 142A-B, 143A-B, 144A-B, 145A-B, 146A-B, and 147A-B, as herein disclosed). It should be noted that the method 800 is merely an example, and is not intended to limit the present disclosure. Accordingly, it is understood that additional operations may be provided before, during, and after the method 800 of FIG. 8, and that some other operations may only be briefly described herein.

In some embodiments, operations of the method 800 may be associated with cross-sectional views of an example 3D memory device 900 at various fabrication stages as shown in FIGS. 9, 10, 11, 12, 13, 14, 15, 16, 17, and 18, respectively, which will be discussed in further detail below. While various operations of the method 800 and associated illustrations shown in FIGS. 9-18 are described with respect to the 3D memory device 900 that includes a number of single-gate memory cells, it should be understood that the operations can be equally applicable to any of various other types of memory cells such as, for example, surrounding-gate memory cells.

In brief overview, the method 800 starts with operation 802 of forming a stack over a substrate. The method 800 proceeds to operation 804 of patterning the stack in a staircase (SC) profile. The method 800 proceeds to operation 806 of depositing an intermetal dielectric (IMD). The method 800 proceeds to operation 808 of forming a number of word line (WL) trenches. The method 800 proceeds to operation 810 of forming a number of WLs. The method 800 proceeds to operation 812 of depositing a number of memory layers and a number of channel layers. The method 800 proceeds to operation 814 of patterning the channel layers. The method 800 proceeds to operation 816 of forming a number of (source/select line) SLs and number of bit lines (BLs). The method 800 proceeds to operation 818 of forming a number of test SC vias. The method 800 proceeds to operation 820 of forming a number of metal routings.

Figure 9:
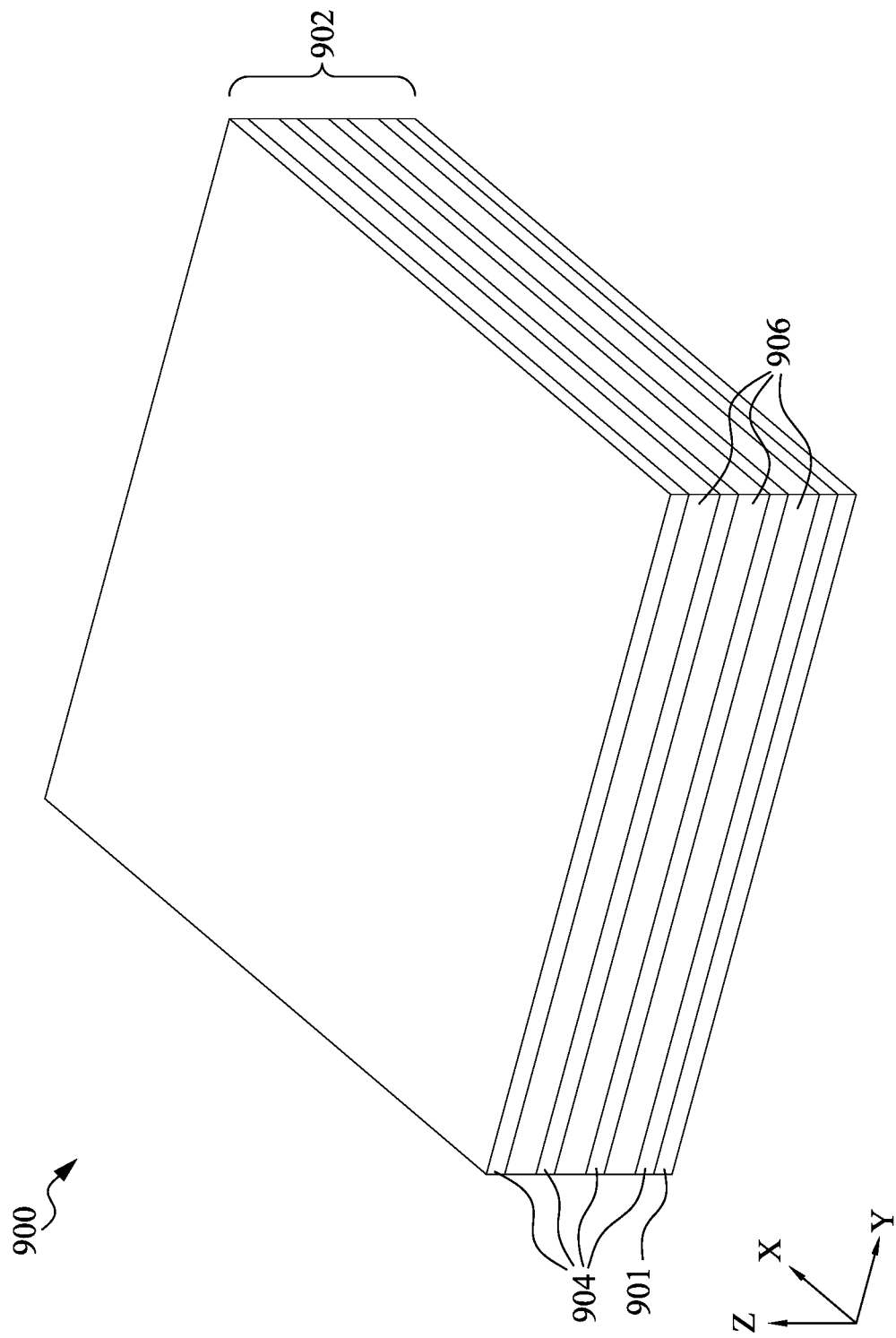
FIGS. 9, 10, 11, 12, 13, 14, 15, 16, 17, and 18 each illustrate a perspective view of an example three-dimensional memory device during various fabrication stages, made by the method of FIG. 8, in accordance with some embodiments.

Corresponding to operation 802 of FIG. 8, FIG. 9 is a perspective view of the 3D memory device 900 including a stack 902 formed over a semiconductor substrate 901 at one of the various stages of fabrication, in accordance with various embodiments.

The substrate 901 may be a semiconductor substrate, such as a bulk semiconductor, a semiconductor-on-insulator (SOI) substrate, or the like, which may be doped (e.g., with a p-type or an n-type dopant) or undoped. The substrate 901 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 901 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The stack 902 includes a number of insulating layers 904 and a number of sacrificial layers 906 alternately stacked on top of one another over the substrate 901 along a vertical direction (e.g., the Z direction). Although four insulating layers 904 and three sacrificial layers 906 are shown in the illustrated embodiment of FIG. 9, it should be understood that the stack 902 can include any number of insulating layers and any number of sacrificial layers alternately disposed on top of one another, while remaining within the scope of the present disclosure. Further, although the stack 902 directly contacts the substrate 902 in the illustrated embodiment of FIG. 9, it should be understood that the stack 902 is separated from the substrate 901. For example, a number of (planar and/or non-planar) transistors may be formed over the substrate 901, and a number of metallization layers, each of which includes a number of contacts electrically connecting to those transistors, may be formed between the substrate 901 and the stack 902. As used herein, the alternately stacked insulating layers 904 and sacrificial layers 906 refer to each of the sacrificial layers 906 being adjoined by two adjacent insulating layers 904. The insulating layers 904 may have the same thickness there amongst, or may have different thicknesses. The sacrificial layers 906 may have the same thickness there amongst, or may have different thicknesses. In some embodiments, the stack 902 may begin with the insulating layer 904 (as shown in FIG. 9) or the sacrificial layer 906.

The insulating layers 904 can include at least one insulating material. The insulating materials that can be employed for the insulating layer 904 include, but are not limited to, silicon oxide (including doped or undoped silicate glass), silicon nitride, silicon oxynitride, organosilicate glass (OSG), spin-on dielectric materials, dielectric metal oxides that are generally known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating layers 904 can be silicon oxide.

The sacrificial layers 906 may include an insulating material, a semiconductor material, or a conductive material. The material of the sacrificial layers 906 is a sacrificial material that can be subsequently removed selective to the material of the insulating layers 904. Non-limiting examples of the sacrificial layers 906 include silicon nitride, an amorphous semiconductor material (such as amorphous silicon), and a polycrystalline semiconductor material (such as polysilicon). In one embodiment, the sacrificial layers 906 can be spacer material layers that include silicon nitride or a semiconductor material including at least one of silicon or germanium.

The stack 902 can be formed by alternately depositing the respective materials of the insulating layers 904 and sacrificial layers 906 over the substrate 901. In some embodiments, one of the insulating layers 904 can be deposited, for example, by chemical vapor deposition (CVD), followed by depositing, for example, using CVD or atomic layer deposition (ALD), one of the sacrificial layers 906.

Figure 10:
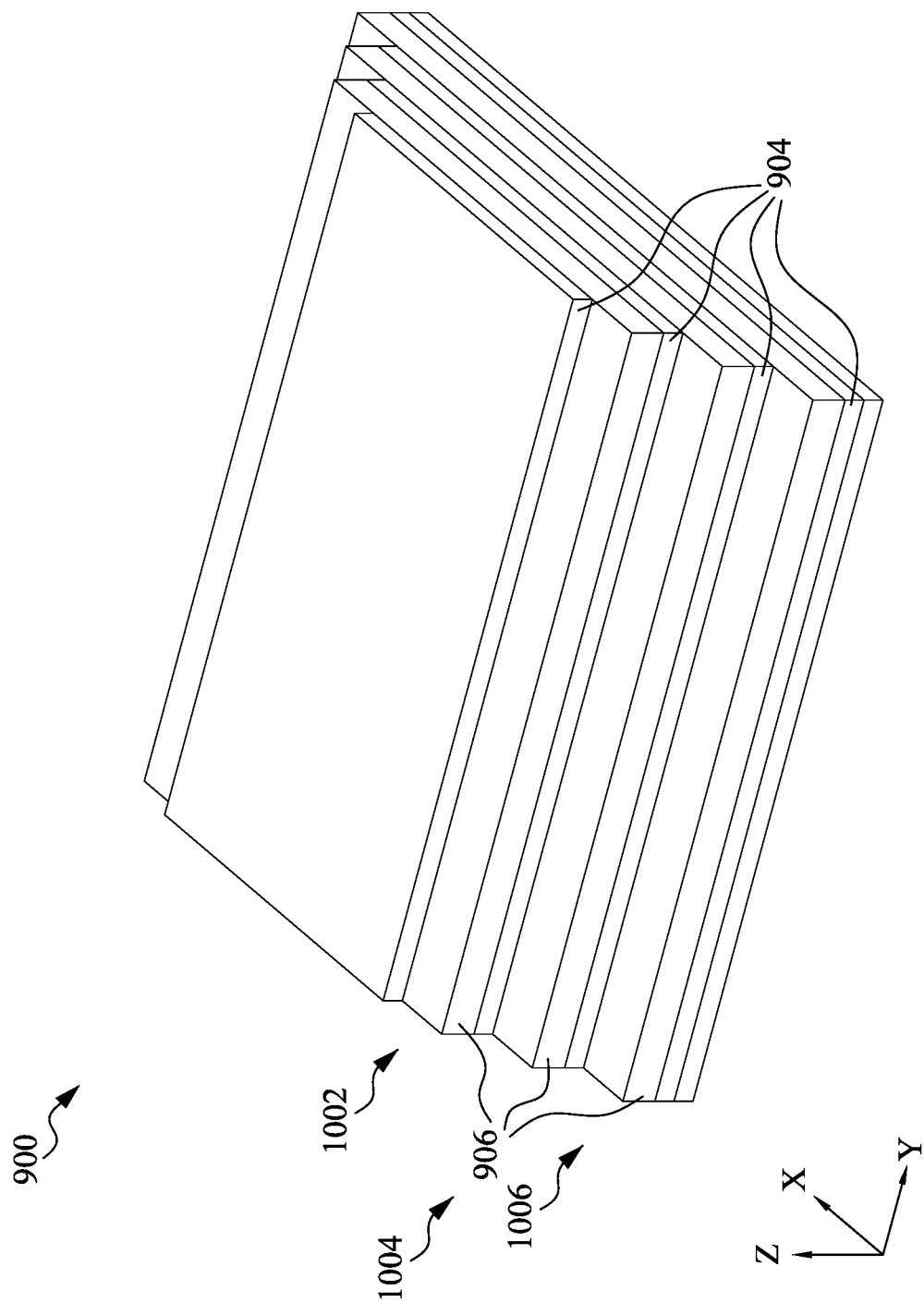

Corresponding to operation 804 of FIG. 8, FIG. 10 is a perspective view of the 3D memory device 900 in which the stack 902 is patterned to form a staircase profile at one of the various stages of fabrication, in accordance with various embodiments.

To form the staircase profile, a mask layer (not shown) is deposited on the stack (on the topmost insulating layer 904), and is patterned. In some embodiments, the mask layer may include a photoresist (e.g., a positive photoresist or a negative photoresist), for example, a single layer or multiple layers of the same photoresist or different photoresists. In other embodiments, the mask layer may include a hard mask layer, for example, a polysilicon mask layer, a metallic mask layer, or any other suitable mask layer.

Next, the mask layer is patterned to etch portions of the mask layer at axial ends off the mask layer in the X-direction, for example, so as to reduce its axial width. The mask layer may be patterned using photolithography techniques. Generally, photolithography techniques utilize a photoresist material that forms the mask layer and that is deposited, irradiated (exposed), and developed to remove a portion of the photoresist material, in this instance, end portions of the mask layer. The remaining mask layer protects the underlying material, such as a portion of the stack 902 below the patterned mask layer, from subsequent processing steps, such as etching.

Next, respective portions of the topmost insulating layer 904 and the topmost sacrificial layer 906 on both sides of the mask layer in the X-direction, are etched. For example, the patterned mask layer is used to etch the exposed portions of the topmost insulating layer 904 and the topmost sacrificial layer 906 so as to form a first step (or stair) 1002 (out of the topmost insulating layer 904 and sacrificial layer 906) over the next lower insulating layer 904 and sacrificial layer 906 (i.e., the second topmost insulating layer 904 and sacrificial layer 906). In some embodiments, the etch may be an anisotropic etch (e.g., a reactive ion etch (ME), neutral beam etch (NBE), deep reactive ion etch (DRIE), and the like, or combinations thereof,) which selectively etches the exposed portions of the topmost insulating and sacrificial layers.

In some embodiments, the etching may include a first etch that selectively etches the topmost insulating layer 904 until the underlying (e.g., topmost) sacrificial layer 906 is exposed, and a second subsequent etch that etches the sacrificial layer 906 until the underlying (e.g., second topmost) insulating layer 904 is exposed. Such two-step etching process may allow the underlying sacrificial layer or the insulating layer to serve as a etch stop such that once a portion of the layer immediately above it has been removed, so as to prevent over-etching.

Next, the mask layer is again etched to reduce its axial width in the X-direction, followed by the two-step etching process to form a second step 1004 (out of the second topmost insulating layer 904 and sacrificial layer 906). By iteratively performing the width reduction process on the mask layer and the two-step etching process, the stack 902 can be patterned to include a number of steps (e.g., steps 1002, 1004, and 1006), which results in the staircase profile as shown in FIG. 10.

Figure 11:
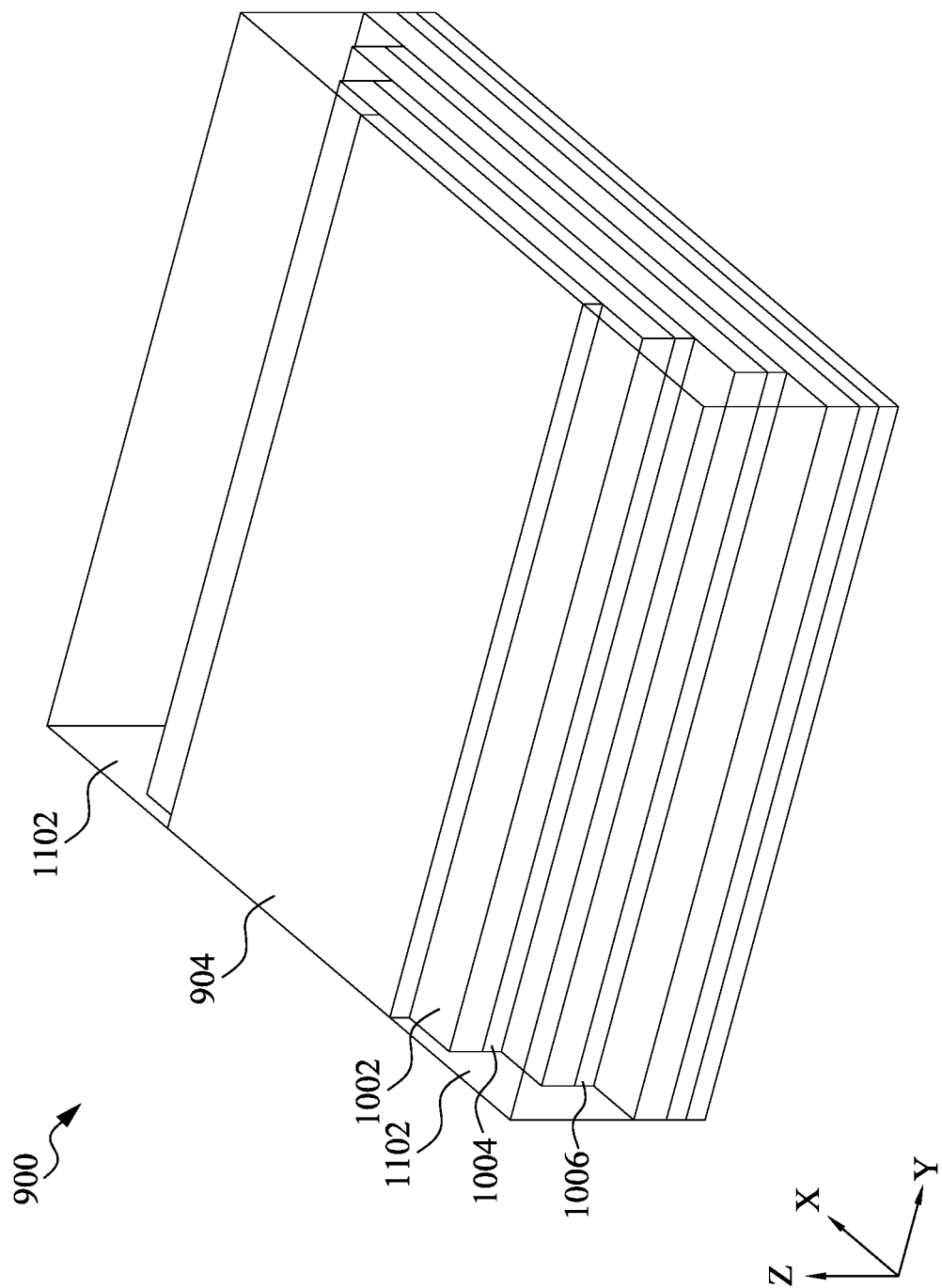

Corresponding to operation 806 of FIG. 8, FIG. 11 is a perspective view of the 3D memory device 900 including an IMD 1102 formed over the stack 902 (having the staircase profile) at one of the various stages of fabrication, in accordance with various embodiments.

The IMD 1102 can be formed by depositing a dielectric material in bulk over the partially formed 3D memory device 900, and polishing the bulk oxide back (e.g., using CMP) to the level of the topmost insulating layer 904, such that the IMD 1102 is disposed only over the steps 1002 to 1006. The dielectric material of the IMD 1102 may include SiO, phosphosilicate glass (PSG), borosilicate glass (BSG), boron-doped phosphosilicate Glass (BPSG), undoped silicate glass (USG), or combinations thereof.

Figure 12:
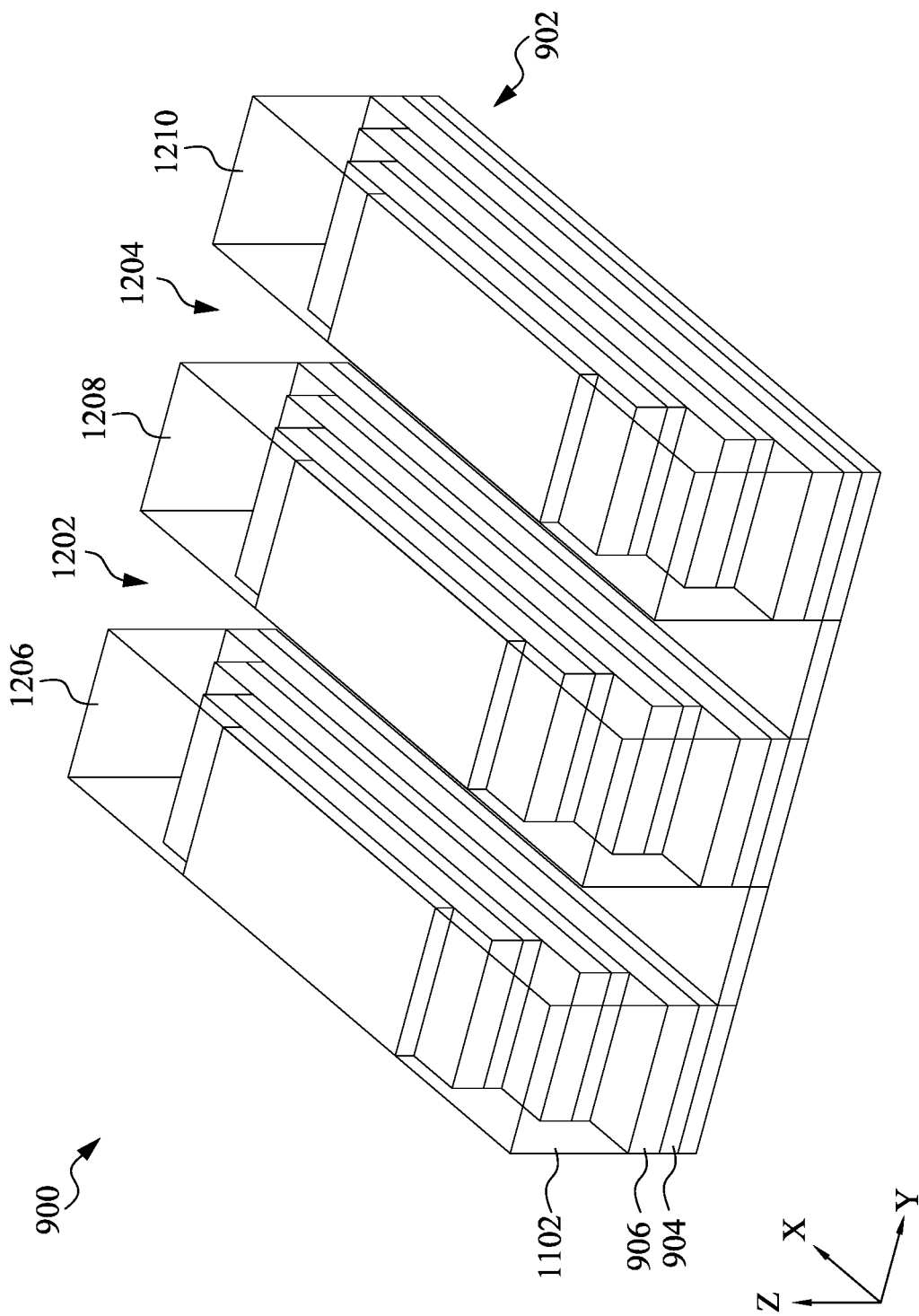

Corresponding to operation 808 of FIG. 8, FIG. 12 is a perspective view of the 3D memory device 900 including a number of WL trenches 1202 and 1204 at one of the various stages of fabrication, in accordance with various embodiments.

Although two WL trenches 1202-1204 are shown in the illustrated embodiment of FIG. 12, it should be understood that the 3D memory device 900 can include any number of WL trenches, while remaining within the scope of the present disclosure. The WL trenches 1202 and 1204 both extend along a lateral direction (e.g., the X direction). The WL trenches 1202 and 1204 can be formed using one or more etching processes. The etching processes may each include, for example, a reactive ion etch (RIE) process, a neutral beam etch (NBE) process, the like, or combinations thereof. The etching processes may be anisotropic.

As a result of forming the WL trenches 1202 and 1204, fin-like structures 1206, 1208, and 1210 are formed. As shown, the fin-like structures 1206 to 1210 (sometimes referred to as stripe structures) all extend along a lateral direction (e.g., the X direction), and are in parallel with one another. Each of the fin-like structures 1206 to 1210 includes a number of layers (or tiers) alternately stacked on top of one another. In particular, each fin-like structure includes an alternate stack of a number of (remaining portions of) the insulating layers 904, a number of (remaining portions of) the sacrificial layers 906, and a remaining portion of the IMD 1102.

Figure 13:
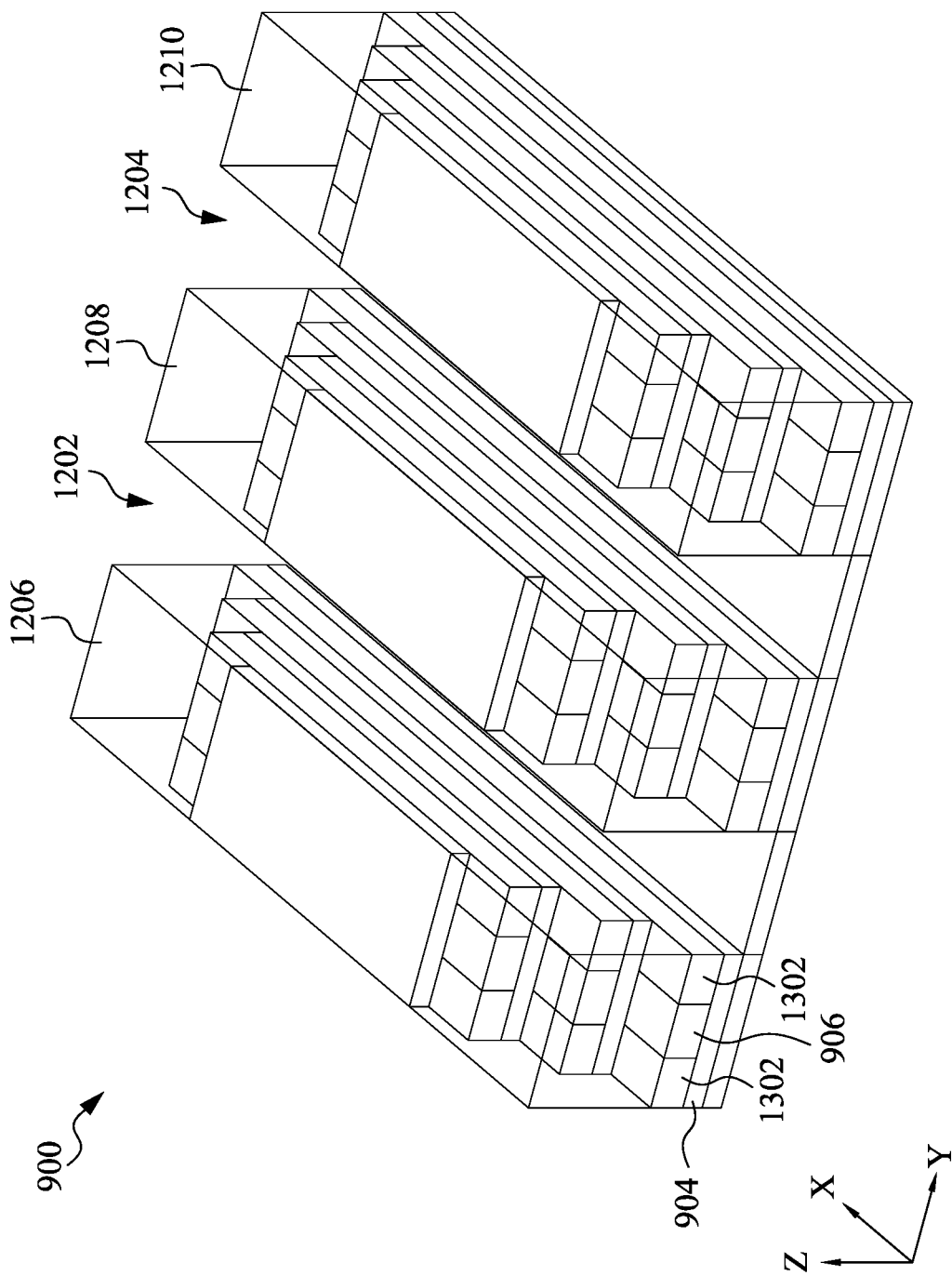

Corresponding to operation 810 of FIG. 8, FIG. 13 is a perspective view of the 3D memory device 900 including a number of WLs 1302 at one of the various stages of fabrication, in accordance with various embodiments.

To form the WLs 1302, respective end portions of each of the sacrificial layers 906 in each of the fin-like structures 1206 to 1210 may be laterally recessed (e.g., along the Y direction). The sacrificial layers 906 can be recessed by performing an etching process that etches the sacrificial layers 906 selective to the insulating layers 904 through the WL trenches 1202 and 1204. Alternatively stated, the insulating layers 904 may remain substantially intact throughout the selective etching process. In some embodiments, each of the sacrificial layers 906 may be inwardly recessed from its both ends (along the Y direction) with a certain etch-back distance. Such an etch-back distance can be controlled to be less than one half the width of the sacrificial layer 906 along the Y direction, so as to remain a central portion of the sacrificial layers 906 intact, as shown in FIG. 13.

The etching process can include a wet etching process employing a wet etch solution, or can be a gas phase (dry) etching process in which the etchant is introduced in a vapor phase into the first trenches (dotted lines). In the example where the sacrificial layers 906 include silicon nitride and the insulating layers 204 include silicon oxide, the etching process can include a wet etching process in which the workpiece is immersed within a wet etch tank that includes phosphoric acid, which etches silicon nitride of the sacrificial layer 906 selective to silicon oxide, silicon, and various other materials of the insulating layers 904.

Next, a metallic fill layer can be (e.g., conformally) formed to fill the "recesses" inwardly extending toward the remaining sacrificial layer 906 with respect to the insulating layer 904, thereby forming the WLs 1302, as shown in FIG. 13. The metallic fill layer includes at least one metal material selected from the group consisting of tungsten, copper, cobalt, ruthenium, titanium, tantalum, or combinations thereof. The metallic fill layer can be deposited by a conformal deposition method, which can be, for example, chemical vapor deposition (CVD), atomic layer deposition (ALD), electroless plating, electroplating, or a combination thereof.

Figure 14:
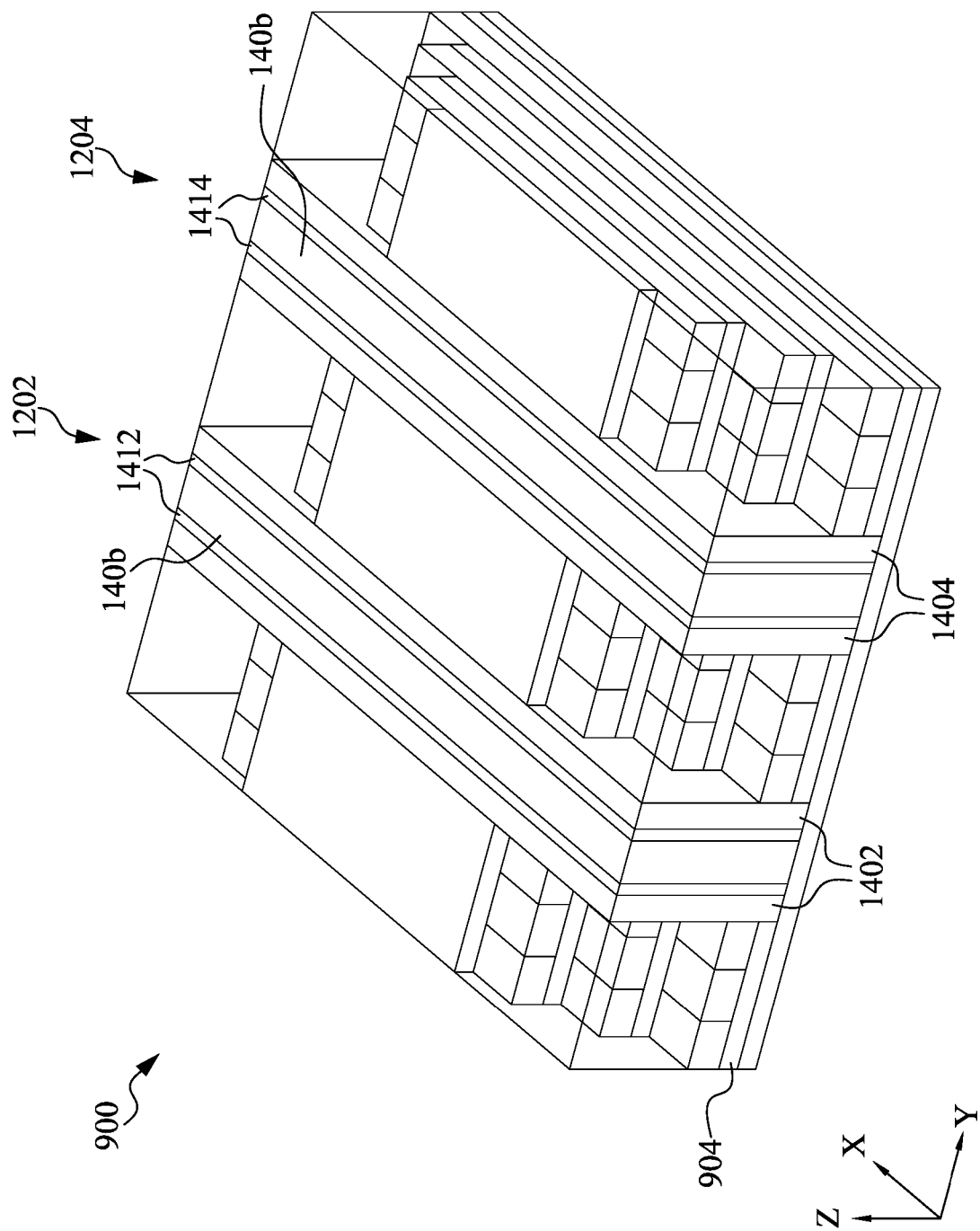

Corresponding to operation 812 of FIG. 8, FIG. 14 is a perspective view of the 3D memory device 900 including a number of memory layers 1402, 1404 and a number of channel layers 1412, 1414 at one of the various stages of fabrication, in accordance with various embodiments.

In various embodiments, each of the memory layers 1402-1404 includes two portions, each of which is formed to extend along one of the sidewalls of a corresponding trench. As such, each portion of the memory layer is in contact with a corresponding number of WLs (through their respective exposed sidewalls). Over the memory layer, each of the channel layers 1412-1414 also includes two portions that are in contact with the two portions of a corresponding memory layer, respectively. As shown in the illustrated example of FIG. 14, the memory layer 1402, including two portions, and the channel layer 1412, including two portions, are formed in the trench 1202; and the memory layer 1404, including two portions, and the channel layer 1414, including two portions, are formed in the trench 1204.

Each of the memory layers 1402-1404, disposed along sidewalls of each of the WL trenches 1202-1204, may include a ferroelectric material, for example, lead zirconate titanate (PZT), PbZr/TiO$_3$, BaTiO$_3$, PbTiO$_2$, etc. However, it should be understood that the memory layers 1402-1404 may each include a charge storage layer, while remaining within the scope of the present disclosure. The memory layers 1402-1404 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layers are each continuous around the sidewalls of the WL trench.

Each of the channel layers 1412-1414 is formed on radially inner surfaces (sidewalls) of the memory layer. In some embodiments, the channel layers 1412-1414 may each be formed from a semiconductor material, for example, Si (e.g., polysilicon or amorphous silicon), Ge, SiGe, silicon carbide (SiC), etc. The channel layers 1412-1414 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the channel layers 1412-1414 are each continuous on the radially inner surfaces of the memory layer.

Each of the WL trenches 1202-1204 is then filled with an insulating material (e.g., SiO, SiN, SiON, SiCN, SiC, SiOC, SiOCN, the like, or combinations thereof) so as to form the inner spacer 1406. In some embodiments, the inner spacer 1406 may be formed from the same material as the plurality of insulating layers 904. The inner spacer 1406 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof.

Figure 15:
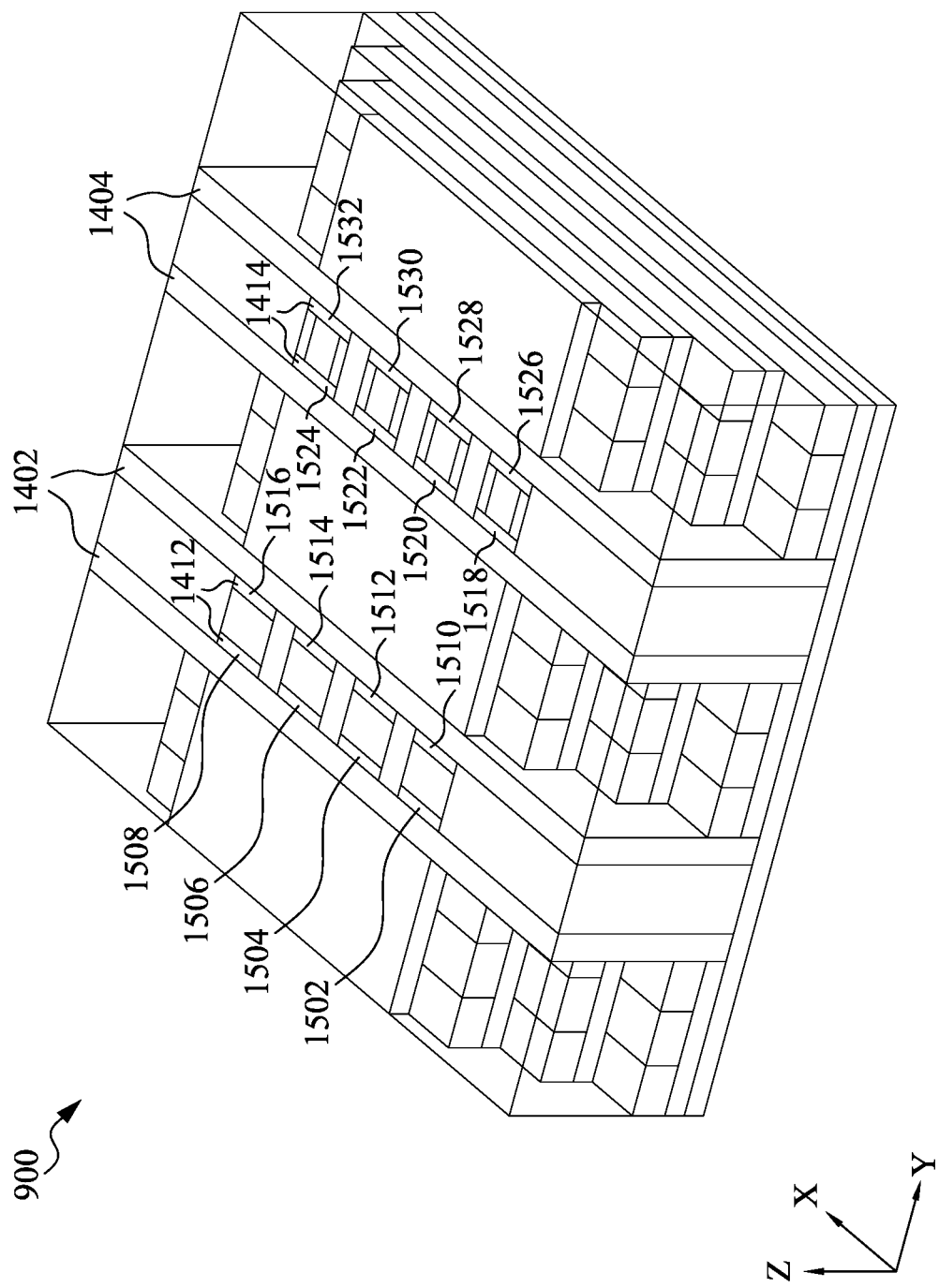

Corresponding to operation 814 of FIG. 8, FIG. 15 is a perspective view of the 3D memory device 900 in which the channel layers 1412 and 1414 are each patterned at one of the various stages of fabrication, in accordance with various embodiments.

In some embodiments, each of the channel layers 1412 and 1414 is patterned into a number of segments, each of which can define the initial footprint of a memory string. For example, the channel layer 1412 is patterned into discrete segments 1502, 1504, 1506, 1508, 1510, 1512, 1514, and 1516; and the channel layer 1414 is patterned into discrete segments 1518, 1520, 1522, 1524, 1526, 1528, 1530, and 1532. Each of such channel segments can serve as the channel of a memory string that includes a number of memory cells disposed across multiple tiers. Hereinafter, channel segments 1502 to 1532 are referred to as "memory strings 1502 to 1532." The segments are electrically isolated from one another by refilling an insulating material (e.g., SiO, SiN, SiON, SiCN, SiC, SiOC, SiOCN, the like, or combinations thereof).

Figure 16:
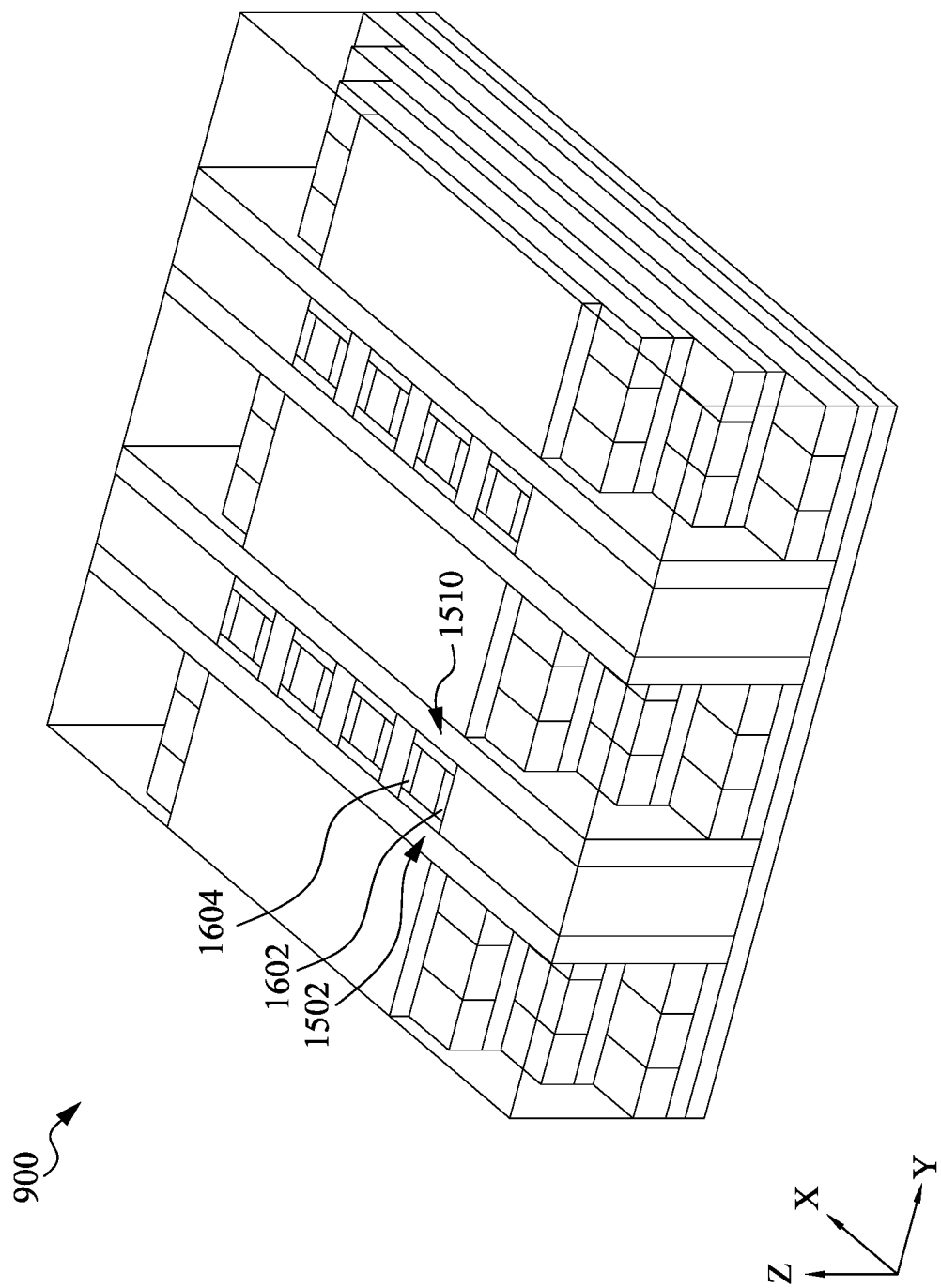

Corresponding to operation 816 of FIG. 8, FIG. 16 is a perspective view of the 3D memory device 900 including a number of BLs 1602 and a number of SLs 1604 at one of the various stages of fabrication, in accordance with various embodiments.

In some embodiments, each of the BLs 1602 and SLs 1604 is formed of a metallic fill material, and extends along the Z direction. Each of the channel segments (or memory strings) is coupled to a pair of BL and SL. Further, two memory strings in a WL trench that face to each other can share a pair of BL and SL. Using the memory stings 1502 and 1510 as a representative example, the memory strings 1502 and 1510 share the vertically extending BL 1602 and SL 1604. The metallic fill layer includes at least one metal material selected from the group consisting of tungsten, copper, cobalt, ruthenium, titanium, tantalum, or combinations thereof. The metallic fill layer can be deposited by a conformal deposition method, which can be, for example, chemical vapor deposition (CVD), atomic layer deposition (ALD), electroless plating, electroplating, or a combination thereof.

Figure 17:
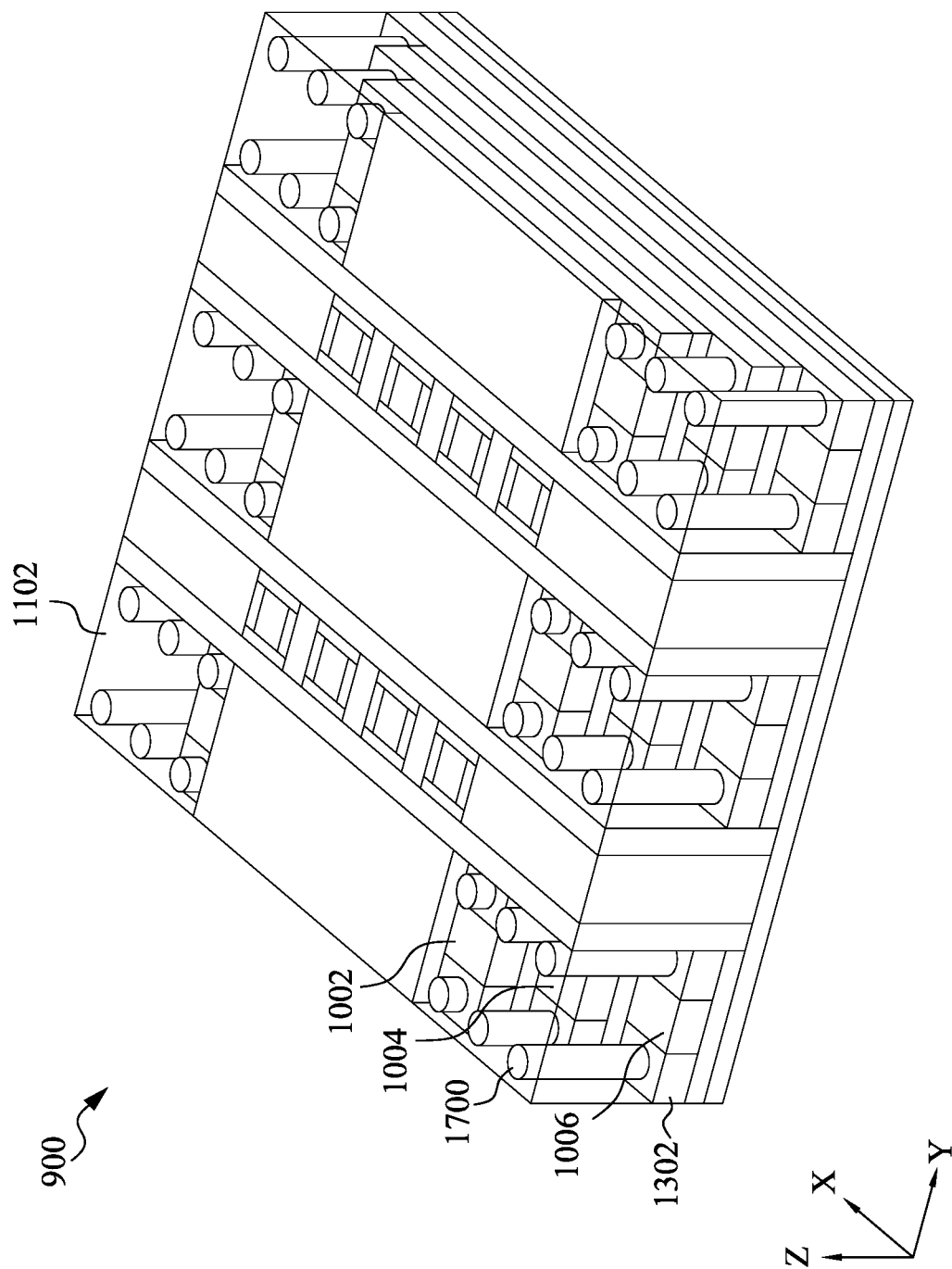

Corresponding to operation 818 of FIG. 8, FIG. 17 is a perspective view of the 3D memory device 900 including a number of test SC vias 1700 at one of the various stages of fabrication, in accordance with various embodiments.

The test SC vias 1700 (substantially similar as the test SC vias 206A and 206B, as discussed above) each penetrate through the IMD 1102 with a respective height (or depth) to land on a respective WL. For example in FIG. 17, a number of test SC vias 1700 vertically extends with a first height to land on the WLs 1302 at the first step 1002; a number of test SC vias 1700 vertically extends with a second height to land on the WLs 1302 at the second step 1004; and a number of test SC vias 1700 vertically extends with a third height to land on the WLs 1302 at the third step 1006. The test SC vias 1700 are formed by etching the IMD 1102 to form a number of openings that expose various portions of the WLs 1302 at different steps, and then filled out with the openings with a metallic fill material. The metallic fill material includes at least one metal material selected from the group consisting of tungsten, copper, cobalt, ruthenium, titanium, tantalum, or combinations thereof. The metallic fill material can be deposited by a conformal deposition method, which can be, for example, chemical vapor deposition (CVD), atomic layer deposition (ALD), electroless plating, electroplating, or a combination thereof.

Figure 18:
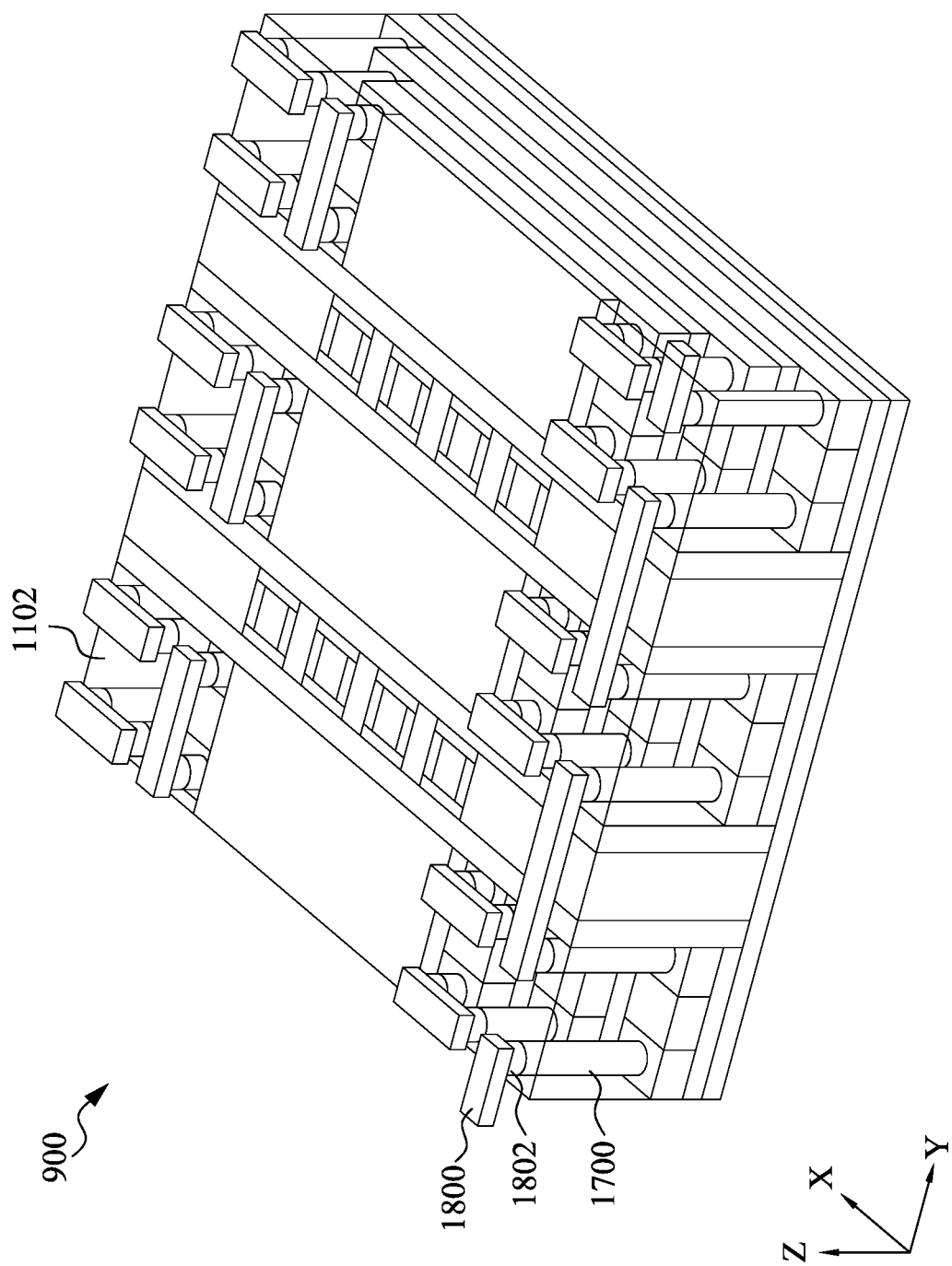

Corresponding to operation 820 of FIG. 8, FIG. 18 is a perspective view of the 3D memory device 900 including a number of metal routings 1800 at one of the various stages of fabrication, in accordance with various embodiments.

The metal routings 1800 (substantially similar as the metal routings 210, as discussed above) electrically couple the test SC vias 1700 in series. Further, each of the metal routings 1800, formed as a horizontal conductive line, is coupled to a respective test SC via through a via, 1802, formed as a vertical conductive line. Such metal routings 1800 and vias 1802 may be formed through a dual-damascene or single-damascene process by forming one or more horizontal and vertical trenches extending through another IMD over the IMD 1102, and filling those trenches with a metallic fill material. The metallic fill material includes at least one metal material selected from the group consisting of tungsten, copper, cobalt, ruthenium, titanium, tantalum, or combinations thereof. The metallic fill material can be deposited by a conformal deposition method, which can be, for example, chemical vapor deposition (CVD), atomic layer deposition (ALD), electroless plating, electroplating, or a combination thereof.

Figure 19:
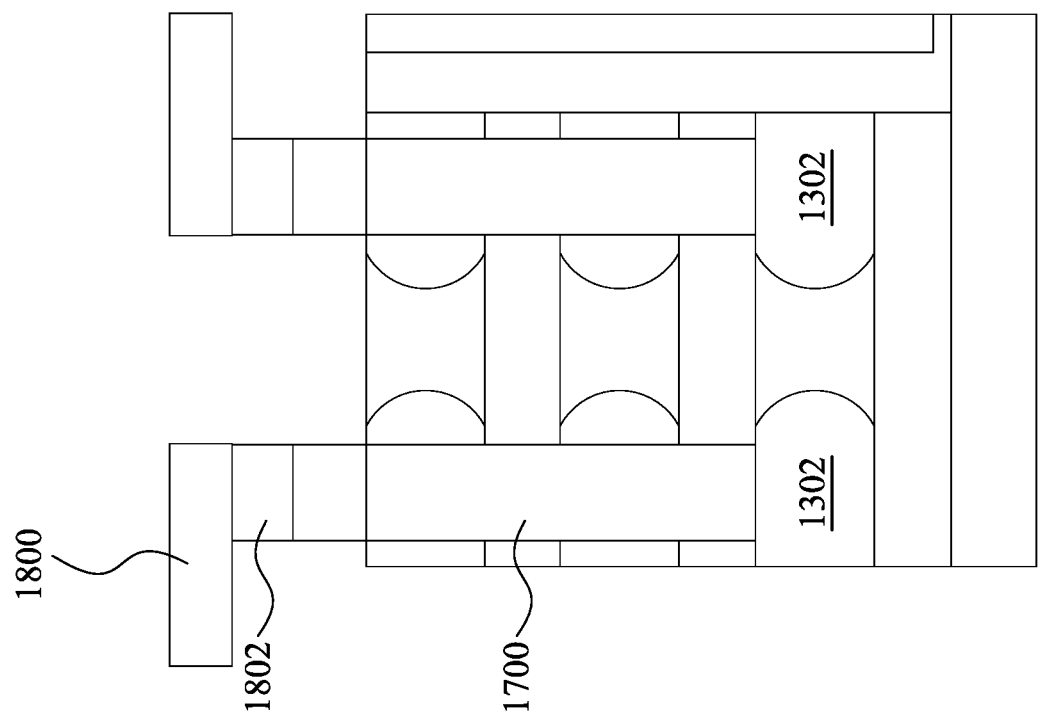
FIG. 19 illustrates a cross-sectional view of the three-dimensional memory device of FIGS. 9-18, in accordance with some other embodiments.

In the illustrated examples of FIG. 13 (and FIGS. 14-18), the recesses are each formed with an edge-based sidewall (e.g., a nearly vertical sidewall), which causes the WLs 1302 to follow such an edge-based inner sidewall. Alternatively stated, an edge-based interface is formed between the remaining central sacrificial layers 906 and the WL 1302. However, the recessed may be formed to have a curvature-based sidewall, which causes the WLs 1302 to follow such a curvature-based inner sidewall, as illustrated in the cross-sectional view of FIG. 19.

To further illustrate the connections between the WL 1302, test SC via 1700, via 1802, and metal routing 1800, FIGS. 20A, 20B, 20C, 20D, 20E, 20F, 20G, 20H, 21A, 21B, 21C, 21D, 21E, 21F, 21G, and 21H illustrate various cross-sectional views of these features, in accordance with various embodiments.

For example, FIGS. 20A-H illustrate the WL 1302, test SC via 1700, via 1802, and metal routing 1800, in which the via 1802 and metal routing 1800 are formed with a width (extending along the Y direction) less than a width of the test SC via 1700 (extending along the Y direction). In particular, FIGS. 20A, 20C, 20E, and 20G illustrate that the via 1802 has a bottom surface aligned with a top surface of the test SC via 1700; FIGS. 20B, 20D, 20F, and 20H illustrate that the via 1802 has a bottom surface below a top surface of the test SC via 1700; FIGS. 20A-D illustrate that the via 1802 and the test SC via 1700 are centrally aligned with each other; FIGS. 20E-H illustrate that the via 1802 and the test SC via 1700 are centrally misaligned with each other; FIGS. 20A, 20B, 20E, and 20F illustrate that the test SC via 1700 has a bottom surface aligned with a top surface of the WL 1302; and FIGS. 20C, 20D, 20G, and 20H illustrate that the test SC via 1700 has a bottom surface aligned below a top surface of the WL 1302.

For example, FIGS. 21A-H illustrate the WL 1302, test SC via 1700, via 1802, and metal routing 1800, in which the via 1802 and metal routing 1800 are formed with a width (extending along the Y direction) greater than a width of the test SC via 1700 (extending along the Y direction). In particular, FIGS. 21A, 21C, 21E, and 21G illustrate that the via 1802 has a bottom surface aligned with a top surface of the test SC via 1700; FIGS. 21B, 21D, 21F, and 21H illustrate that the via 1802 has a bottom surface below a top surface of the test SC via 1700; FIGS. 21A-D illustrate that the via 1802 and the test SC via 1700 are centrally aligned with each other; FIGS. 21E-H illustrate that the via 1802 and the test SC via 1700 are centrally misaligned with each other; FIGS. 21A, 21B, 21E, and 21F illustrate that the test SC via 1700 has a bottom surface aligned with a top surface of the WL 1302; and FIGS. 21C, 21D, 21G, and 21H illustrate that the test SC via 1700 has a bottom surface aligned below a top surface of the WL 1302.

In one aspect of the present disclosure, a memory device is disclosed. The memory device includes a first memory block that includes a first memory sub-array; a first interface portion disposed next to the first memory sub-array, the first interface portion having a staircase profile; and a plurality of first interconnect structures electrically coupled to the first memory sub-array through the first interface portion. The memory device includes a first test structure disposed next to the first semiconductor device, the first test structure configured to simulate electrical connections of the plurality of first interconnect structures. The memory device includes a second test structure disposed next to the first semiconductor device, the second test structure configured to simulate electrical connections of the plurality of first interconnect structures. The first and second test structures are electrically coupled to each other, and are each electrically isolated from the first memory block.

In another aspect of the present disclosure, a memory device is disclosed. The memory device includes a plurality of memory sub-arrays. Each of the memory sub-arrays is accessed through a staircase of word lines (WLs) and a plurality of interconnect structures. The memory device includes a plurality of test structures. Each of the test structures corresponds to one of the memory sub-arrays, and includes: (i) a staircase of test WLs that emulate the staircase of WLs coupled to the corresponding memory sub-array, and (ii) a plurality of test interconnect structures that emulate the interconnect structures coupled to the corresponding memory sub-array. The plurality of test structures are electrically coupled to one another in series.

In yet another aspect of the present disclosure, a method for testing a memory device is disclosed. The method includes forming a plurality of test structures respectively emulating a plurality of memory sub-arrays. Each of the test structures is physically disposed next to but electrically isolated from a corresponding one of the memory sub-arrays. The method includes coupling the test structures in series. The method includes determining whether a level of current conducting through the serially connected test structures satisfies a condition. The method includes testing, based on the determination, one of the test structures by bypassing the rest of the test structures at a time so as to identify electrical connection issues in one or more of the memory sub-arrays.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
  a first memory block comprising:
    a first memory sub-array;
    a first interface portion disposed next to the first memory sub-array, the first interface portion having a staircase profile;
    a plurality of first interconnect structures electrically coupled to the first memory sub-array through the first interface portion;
    a first test structure disposed next to the first memory bank, the first test structure configured to simulate electrical connections of the plurality of first interconnect structures; and
    a second test structure disposed next to the first memory bank, the second test structure configured to simulate electrical connections of the plurality of first interconnect structures;
    wherein the first and second test structures are electrically coupled to each other, and are each electrically isolated from the first memory block.

2. The memory device of claim 1, wherein each of the first and second test structures comprises:
  a test interface portion that emulates the staircase profile of the first interface portion; and
  a plurality of test interconnect structures that emulate profiles of the plurality of interconnect structures, respectively.

3. The memory device of claim 2, wherein the test interconnect structures are electrically coupled to one another in series through the test interface portion.

4. The memory device of claim 2, wherein the test interface portion comprises a plurality of test access lines, each of the access lines configured to activate a plurality of test memory cells, and wherein a first one of the test interconnect structures that is in contact with a first one of the test access lines is electrically coupled to a second one of the test interconnect structures that is in contact with a second one of the test access lines.

5. The memory device of claim 4, wherein the first and second test access lines, both extending along a direction, are vertically disposed with respect to each other.

6. The memory device of claim 5, wherein one of the first and second test access lines extend farther along the direction than the other of the first and second test access lines.

7. The memory device of claim 1, further comprising:
  a second memory block that comprises:
    a second memory sub-array;
    a second interface portion disposed next to the second memory sub-array, the second interface portion having a staircase profile; and
    a plurality of second interconnect structures electrically coupled to the memory sub-array through the second interface portion;
    a third test structure disposed next to the second memory block, the third test structure configured to simulate electrical connections of the plurality of second interconnect structures; and
    a fourth test structure disposed next to the second memory block, the fourth test structure configured to simulate electrical connections of the plurality of second interconnect structures;
    wherein the third and fourth test structures are electrically coupled to each other, and are each electrically isolated from the second memory block.

8. The memory device of claim 7, wherein the first through fourth test structures are electrically coupled to one another in series.

9. The memory device of claim 7, further comprising:
  a first switch electrically coupled between
  (i) one of the first or second test structure and
  (ii) one of the third or fourth test structure; and a second switch configured to bypass the first and second test structures.

10. The memory device of claim 9, the first and second switches are alternately activated so as to selectively bypass the first and second test structures.

11. The memory device of claim 7, wherein the first and second memory blocks are formed over a single die.

12. A memory device, comprising:
  a plurality of memory sub-arrays, wherein each of the memory sub-arrays is accessed through a staircase of word lines (WLs) and a plurality of interconnect structures; and
  a plurality of test structures, wherein each of the test structures corresponds to one of the memory sub-arrays, and comprises: (i) a staircase of test WLs that emulate the staircase of WLs coupled to the corresponding memory sub-array, and (ii) a plurality of test interconnect structures that emulate the interconnect structures coupled to the corresponding memory sub-array;
    wherein the plurality of test structures are electrically coupled to one another in series.

13. The memory device of claim 12, further comprising:
a plurality of first switches, wherein each of the first switches is selected to electrically couple a first one of the test structures disposed next to a first one of the memory sub-arrays to a second one of the test structures disposed next to a second one of the memory sub-arrays; and
a plurality of second switches, wherein each of the second switches is selected to bypass a corresponding one of the test structures.

14. The memory device of claim 12, each of the test structures is electrically isolated from the corresponding memory sub-array.

15. The memory device of claim 12, wherein, in each of the test structures, the staircase of test WLs comprises:
a first test WL that extends along a lateral direction; and
a second test WL that extends along the lateral direction and is disposed below the first test WL, wherein the second test WL is longer than the first test WL along the lateral direction.

16. The memory device of claim 15, wherein, in each of the test structures, the test interconnect structures comprise:
a first test interconnect structure that extends along a vertical direction and is in contact with the first test WL;
a second test interconnect structure, electrically coupled to the first test interconnect structure, that extends along the vertical direction and is in contact with the second test WL; and
a third test interconnect structure that extends along the vertical direction and is in contact with the second test WL.

17. The memory device of claim 12, wherein the plurality of memory sub-arrays and the plurality of test structures are formed on a single die.

18. A memory device, comprising:
a plurality of memory sub-arrays, wherein each of the memory sub-arrays is accessed through a staircase of word lines (WLs) and a plurality of interconnect structures; and
a plurality of test structures, wherein each of the test structures corresponds to one of the memory sub-arrays, and comprises:
(i) a staircase of test WLs that emulate the staircase of WLs coupled to the corresponding memory sub-array, and
(ii) a plurality of test interconnect structures that emulate the interconnect structures coupled to the corresponding memory sub-array;
wherein the plurality of test structures are electrically coupled to one another in series, and each of the test structures is electrically isolated from the corresponding memory sub-array.

19. The memory device of claim 18, wherein, in each of the test structures, the staircase of test WLs comprises:
a first test WL that extends along a lateral direction; and
a second test WL that extends along the lateral direction and is disposed below the first test WL, wherein the second test WL is longer than the first test WL along the lateral direction.

20. The memory device of claim 19, wherein, in each of the test structures, the test interconnect structures comprise:
a first test interconnect structure that extends along a vertical direction and is in contact with the first test WL;
a second test interconnect structure, electrically coupled to the first test interconnect structure, that extends along the vertical direction and is in contact with the second test WL; and
a third test interconnect structure that extends along the vertical direction and is in contact with the second test WL.

\* \* \* \* \*